US009576986B2

(12) United States Patent
Sakakura et al.

(10) Patent No.: US 9,576,986 B2
(45) Date of Patent: Feb. 21, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Masayuki Sakakura, Kanagawa (JP); Hideto Ohnuma, Kanagawa (JP); Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 280 days.

(21) Appl. No.: 14/340,717

(22) Filed: Jul. 25, 2014

(65) Prior Publication Data

US 2014/0332867 A1 Nov. 13, 2014

Related U.S. Application Data

(62) Division of application No. 12/558,618, filed on Sep. 14, 2009, now Pat. No. 8,804,060, which is a division
(Continued)

(30) Foreign Application Priority Data

Oct. 18, 2005 (JP) ................................. 2005-303674

(51) Int. Cl.
*G02F 1/136* (2006.01)
*H01L 29/04* (2006.01)
(Continued)

(52) U.S. Cl.
CPC ..... *H01L 27/1244* (2013.01); *H01L 21/76816* (2013.01); *H01L 21/76879* (2013.01);
(Continued)

(58) Field of Classification Search
CPC . H01L 27/124; H01L 27/1288; H01L 27/1214
(Continued)

(56) References Cited

U.S. PATENT DOCUMENTS 5,266,519 A  11/1993 Iwamoto
6,407,780 B1  6/2002 Sung
(Continued)

FOREIGN PATENT DOCUMENTS

CN  001607444 A  4/2005
JP  59-068952 A  4/1984
(Continued)

OTHER PUBLICATIONS

Taiwanese Office Action (Application No. 102122952) Dated Apr. 8, 2015.
(Continued)

*Primary Examiner* — David Vu
*Assistant Examiner* — Brandon Fox
(74) *Attorney, Agent, or Firm* — Fish & Richardson P.C.

(57) ABSTRACT

It is an object of the present invention to provide a method for preventing a breaking and poor contact, without increasing the number of steps, thereby forming an integrated circuit with high driving performance and reliability. The present invention applies a photo mask or a reticle each of which is provided with a diffraction grating pattern or with an auxiliary pattern formed of a semi-translucent film having a light intensity reducing function to a photolithography step for forming wires in an overlapping portion of wires. And a conductive film to serve as a lower wire of a two-layer structure is formed, and then, a resist pattern is formed so that a first layer of the lower wire and a second layer narrower than the first layer are formed for relieving a steep step.

12 Claims, 12 Drawing Sheets

Related U.S. Application Data of application No. 11/594,400, filed on Oct. 13, 2006, now Pat. No. 7,601,566.

(51) Int. Cl.
| | |
|---|---|
| *H01L 27/12* | (2006.01) |
| *H01L 21/768* | (2006.01) |
| *H01L 23/528* | (2006.01) |
| *H01L 27/32* | (2006.01) |

(52) U.S. Cl.
CPC .......... *H01L 23/528* (2013.01); *H01L 27/124* (2013.01); *H01L 27/1214* (2013.01); *H01L 27/1259* (2013.01); *H01L 27/1288* (2013.01); *H01L 27/3276* (2013.01); *H01L 2924/0002* (2013.01)

(58) Field of Classification Search
USPC .................................... 257/59, 213; 349/42
See application file for complete search history.

(56) References Cited

U.S. PATENT DOCUMENTS

| | | | |
|---|---|---|---|
| 6,628,361 B2 | 9/2003 | Takahashi et al. | |
| 6,773,944 B2 | 8/2004 | Okamoto | |
| 6,887,742 B2 | 5/2005 | Baek et al. | |
| 6,897,477 B2 | 5/2005 | Shibata et al. | |
| 7,169,656 B2 | 1/2007 | Ohnuma et al. | |
| 7,223,643 B2 | 5/2007 | Ohnuma et al. | |
| 7,262,469 B2 | 8/2007 | Makita | |
| 7,316,946 B2 | 1/2008 | Ohnuma et al. | |
| 7,335,538 B2 | 2/2008 | Chou et al. | |
| 7,351,623 B2* | 4/2008 | Ahn ................. | G02F 1/136286 257/E27.111 |
| 7,374,983 B2 | 5/2008 | Okamoto | |
| 7,422,984 B2 | 9/2008 | Okamoto | |
| 7,588,970 B2 | 9/2009 | Ohnuma et al. | |
| 7,760,317 B2 | 7/2010 | Lim et al. | |
| 7,807,516 B2 | 10/2010 | Ohnuma et al. | |
| 8,043,902 B2 | 10/2011 | Ohnuma et al. | |
| 2002/0094612 A1 | 7/2002 | Nakamura et al. | |
| 2002/0102776 A1 | 8/2002 | Yamazaki et al. | |
| 2002/0106825 A1 | 8/2002 | Lee et al. | |
| 2003/0007108 A1 | 1/2003 | Hwang et al. | |
| 2005/0134755 A1* | 6/2005 | Yang ................. | G02F 1/136227 349/43 |
| 2006/0275710 A1 | 12/2006 | Yamazaki et al. | |
| 2006/0278875 A1 | 12/2006 | Ohnuma et al. | |
| 2006/0292865 A1 | 12/2006 | Yamazaki et al. | |
| 2007/0001225 A1 | 1/2007 | Ohnuma et al. | |
| 2007/0023790 A1 | 2/2007 | Ohnuma et al. | |
| 2007/0037069 A1 | 2/2007 | Ohnuma | |
| 2007/0037070 A1 | 2/2007 | Ohnuma et al. | |
| 2007/0037311 A1 | 2/2007 | Izumi et al. | |
| 2007/0139571 A1 | 6/2007 | Kimura | |
| 2008/0119024 A1 | 5/2008 | Ohnuma et al. | |
| 2009/0004872 A1 | 1/2009 | Okamoto | |
| 2009/0153046 A1* | 6/2009 | Hayashi ............. | H01L 27/3276 313/505 |
| 2011/0012113 A1 | 1/2011 | Ohnuma et al. | |

FOREIGN PATENT DOCUMENTS

| | | |
|---|---|---|
| JP | 01-205596 A | 7/1989 |
| JP | 02-156624 A | 6/1990 |
| JP | 03-104190 A | 5/1991 |
| JP | 2000-151523 A | 5/2000 |
| JP | 2001-185616 A | 7/2001 |
| JP | 2001-201756 A | 7/2001 |
| JP | 2001-242483 A | 9/2001 |
| JP | 2002-151523 A | 5/2002 |
| JP | 2003-209260 A | 7/2003 |
| JP | 2003-223119 A | 8/2003 |
| JP | 5046565 | 10/2012 |
| JP | 5137342 | 2/2013 |
| TW | 588177 | 5/2004 |

OTHER PUBLICATIONS

Kim.C et al., "A Novel Four-Mask-Count Process Architecture For TFT-LCDs", SID Digest '00: SID International Symposium Digest of Technical Papers, 2000, vol. 31, pp. 1006-1009.

Taiwanese Office Action (Application No. 95138108) Dated Feb. 19, 2013.

\* cited by examiner

SEMICONDUCTOR DEVICE AND MANUFACTURING METHOD THEREOF

CROSS-REFERENCE TO RELATED APPLICATIONS

This application is a divisional of U.S. application Ser. No. 12/558,618, filed Sep. 14, 2009, now allowed, which is a divisional of U.S. application Ser. No. 11/549,400, filed Oct. 13, 2006, now U.S. Pat. No. 7,601,566, which claims the benefit of a foreign priority application filed in Japan as Serial No. 2005-303674 on Oct. 18, 2005, all of which are incorporated by reference.

BACKGROUND OF THE INVENTION

1. Field of the Invention

The present invention relates to a semiconductor device including a circuit including a semiconductor element and a manufacturing method thereof. In addition, the present invention relates to an electronic appliance to which a light emitting display device including an organic light emitting element or an electro-optic device typified by a liquid crystal display panel is mounted as a part component. Note that in this specification, a semiconductor device refers to a device in general which functions by utilizing semiconductor characteristics. Electro-optic devices, semiconductor circuits, and electronic appliances are all semiconductor devices.

2. Description of the Related Art

Conventionally, a structure is widely known where thin film transistors (also referred to as TFTs) are integrated to be utilized, in the case where a circuit in an active matrix liquid crystal display device, an image sensor, or the like is formed over a glass substrate. In this case, a wiring over a substrate is generally formed by forming a first wire which is a lower wire, forming an interlayer insulator, and then, forming a second wire which is an upper wire. If necessary, a third layer and a fourth layer of a wiring may be formed.

In addition, a TFT manufacturing process is known where a photo mask (hereinafter, referred to as a light exposure mask) or a reticle each of which is provided with a diffraction grating pattern or with an auxiliary pattern formed of a semi-translucent film having a light intensity reducing function is applied to a photolithography step for forming a gate electrode (see Patent Document 1).
Patent Document 1 Japanese Published Patent Application No. 2000-151523

A problem of a semiconductor device including a semiconductor element is a breaking (that is, a breakage caused at a step corner) of an upper wire in a portion where a lower wire and the upper wire formed thereover intersect with each other (an overlapping portion). The problem is caused because an edge of the lower wire is steep and an interlayer insulating film formed thereover does not sufficiently cover the lower wire.

To prevent such a breaking, it is required to thicken the upper wire. For example, the upper wire is desirably about twice as thick as a gate wire which is the lower wire. However, this means that unevenness of an integrated circuit is further increased. Besides, when a wire is required to be formed over the integrated circuit, breaking of the wire due to the thickness of the upper wire has to be taken into consideration. In addition, when forming a circuit in which unevenness of an integrated circuit is unfavorable like a liquid crystal display device, it is practically impossible to increase the thickness of the upper wire.

SUMMARY OF THE INVENTION

In an integrated circuit, one breaking causes a whole defect. Therefore, it is an important challenge to reduce breaking. It is an object of the present invention to provide a method for decreasing a defect of a breaking without increasing the number of steps and improve yield of an integrated circuit.

It is an object of the present invention to provide a semiconductor device including a circuit with high driving performance and reliability. It is another object of the present invention to improve reliability of an electronic appliance including the semiconductor device by improving reliability of the semiconductor device.

The present invention applies a photo mask or a reticle each of which is provided with a diffraction grating pattern or with an auxiliary pattern formed of a semi-translucent film having a light intensity reducing function to a photolithography step for forming wires in an overlapping portion of wires. And a conductive film to serve as a lower wire of a two-layer structure is formed, and then, a resist pattern is formed so that a first layer of the lower wire and a second layer narrower than the first layer are formed for relieving a steep step. Note that in this specification, a lower wire, an interlayer insulating film, and an upper wire are formed sequentially over the substrate.

One of the structures disclosed in this specification includes a first wire formed over an insulating surface; a second wire formed over the first wire, extending in the same direction as the first wire; an insulating film over the second wire, covering the second wire; and a third wire formed over the insulating film, intersecting with the first wire and the second wire; wherein in an intersection portion and a vicinity of the intersection portion with the second wire and the third wire, the first wire is wider than the second wire.

One of the structures disclosed in this specification includes a first wire formed over an insulating surface; a second wire formed over the first wire, extending in the same direction as the first wire; a third wire formed over the second wire, electrically connecting to the first wire and the second wire, and intersecting with the first wire and the second wire; and an insulating film covering the first wire, the second wire, and the third wire; wherein in an intersection portion and a vicinity of the intersection portion with the second wire and the third wire, the first wire is wider than the second wire.

Note that the widths of the first wire and the second wire are preferably the same or almost the same in a region other than the intersection portion and the vicinity of the intersection portion with the second wire and the third wire. Alternatively, a difference between the widths of the first wire and the second wire is preferably smaller in a region other than the intersection portion and the vicinity of the intersection portion with the second wire and the third wire. That is, a difference between the widths of the first wire and the second wire is preferably smaller in the region other than the intersection portion and the vicinity of the intersection portion than that in the intersection portion and the vicinity of the intersection portion.

In the region other than the intersection portion and the vicinity of the intersection portion, a breaking is not taken into consideration; therefore, the first wire can be formed to be narrow. Accordingly, the width of the first wire in the intersection portion and the vicinity of the intersection portion and the width of the first wire in the region other than the intersection portion and the vicinity of the intersection portion are preferably the same or almost the same. Alternatively, the first wire in the region other than the intersection portion and the vicinity of the intersection portion is preferably narrower than the first wire in the intersection portion and the vicinity of the intersection portion It is preferable that the first wire in the intersection portion and the vicinity of the intersection portion with the second wire and the third wire be wider than the second wire, and in the other region, the widths of the first wire and the second wire be the same or difference therebetween be small. With such a structure, a step of the wires is relieved in the intersection portion and the vicinity of the intersection portion to prevent disconnection, thereby making coverage of the wire and the insulating film preferable. In addition, in the region other than the intersection portion and the vicinity of the intersection portion, the wire can be narrow, thereby realizing miniaturization. Further in addition, in a region other than the intersection portion, the widths of the first wire and the second wire are the same or difference therebetween is small, so that a gap between the wires can be narrow and high integration becomes possible.

One of the structures disclosed in this specification includes a first wire formed over an insulating surface; a second wire formed over the first wire, extending in the same direction as the first wire; an interlayer insulating film covering the second wire; and a third wire electrically connecting with the first wire and the second wire through an opening portion formed in the interlayer insulating film; wherein in the opening portion, the first wire is wider than the second wire.

In the above structure, the first wire serves as an etching stopper in the opening portion, thereby improving a junction property of the first wire, the second wire and the third wire.

Note that the opening portion may be overlapped with an edge of the second wire so that an area in which the second wire and the third wire are in contact with each other becomes larger; therefore, a junction property in the opening portion can be improved.

In addition, an edge of the first wire is projected from the edge of the second wire, and the first wire is longer than the second wire. Accordingly, the first wire serves as an etching stopper, thereby improving a junction property of the second wire and the third wire.

In any of the foregoing structures, the first wire, the second wire, and a semiconductor element are formed over one substrate; the semiconductor element has a semiconductor layer, a gate insulating film, and a gate electrode; the gate electrode has a first gate electrode, a second gate electrode formed over the first gate electrode to be in contact with each other; and the gate electrode is formed of the same material as the first layer and the second gate electrode may be formed of the same material as the second wire.

In any of the foregoing structures, side surfaces of the first wire may form a tapered shape. Alternatively, the side surfaces of the first wire and side surfaces of the second wire may form tapered shapes. In that case, an angle between the side surface of the first wire and a substrate surface is smaller than an angle between the side surface of the second wire and the substrate surface. By applying tapered shapes, the step of the wires can be further relieved to prevent breakage.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask being partially thin and the second mask having a uniform thickness; forming a first wire and a second wire partially narrower than the first wire by etching the first conductive film and the second conductive film using the first mask and the second mask; forming an insulating film covering the first wire and the second wire; and forming a third wire over the insulating film, intersecting with the first wire and the second wire; wherein the third wire overlaps with the first wire and the second wire in a part in which the first wire is wider than the second wire.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask having at least two different thicknesses and the second mask having a uniform thickness; forming a first wire and a second wire partially narrower than the first wire by etching the first conductive film and the second conductive film using the first mask and the second mask; forming an insulating film covering the first wire and the second wire; and forming a third wire over the insulating film, intersecting with the first wire and the second wire, wherein the third wire overlaps with the first wire and the second wire in a part in which the first wire is wider than the second wire.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask being partially thin and the second mask having a uniform thickness; forming a first wire and a second wire partially narrower than the first wire by etching the first conductive film and the second conductive film using the first mask and the second mask; forming a third wire electrically connecting with the first wire and the second wire and intersecting with the first wire and the second wire; and forming an insulating film covering the first wire, the second wire, and the third wire; wherein the third wire overlaps with the first wire and the second wire in a part in which the first wire is wider than the second wire.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask having at least two different thicknesses and the second mask having a uniform thickness; forming a first wire and a second wire partially narrower than the first wire by etching the first conductive film and the second conductive film using the first mask and the second mask; forming a third wire electrically connecting with the first wire and the second wire and intersecting with the first wire and the second wire; and forming an insulating film covering the first wire, the second wire, and the third wire; wherein the third wire overlaps with the first wire and the second wire in a part in which the first wire is wider than the second wire.

In the foregoing structure, the second mask may be used for etching to make the widths of the first wire and the second wire the same or almost the same.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask being partially thin and the second mask having a uniform thickness; forming a first wire and a second wire partially narrower than the first wire by etching the first conductive film and the second conductive film using the first mask and the second mask; forming an insulating film covering the first wire and the second wire; forming an opening portion in the insulating film, exposing at least a top surface of the first wire and a top surface of the second wire; and forming a third wire over the insulating film, electrically connecting to the first wire and the second wire through the opening portion.

One of the structures disclosed in this specification includes forming a first conductive film over an insulating surface; forming a second conductive film over the first conductive film to be in contact with each other; forming a first mask and a second mask using a photo mask or a reticle each of which is provided with a diffraction grating pattern or with an auxiliary pattern formed of a semi-translucent film having a light intensity reducing function, the first mask having at least two different thicknesses and the second mask having a uniform thickness; forming a first wire and a second wire partially narrower than the first wire by etching the first conductive film and the second conductive film using the first mask and the second mask; forming an insulating film covering the first wire and the second wire; forming an opening portion in the insulating film, exposing at least a top surface of the first wire and a top surface of the second wire; and forming a third wire over the insulating film, electrically connecting to the first wire and the second wire through the opening portion.

Note that the opening portion is overlapped with an edge of the second wire, so that an area in which the second wire and the third wire are in contact with each other becomes larger; therefore, a junction property in the opening portion can be improved.

Alternatively, the opening portion may be formed so as to expose the edge of the second wire. Note that an edge of the first wire is projected from the edge of the second wire, and the first wire is longer than the second wire. Accordingly, the first wire serves as an etching stopper, thereby improving a junction property of the second wire and the third wire.

In any of the foregoing structures, the first wire, the second wire, and a semiconductor element are formed over one substrate; the semiconductor element has a semiconductor layer, a gate insulating film, and a gate electrode; the gate electrode is formed by a first gate electrode and a second gate electrode formed to be in contact with each other; the first gate electrode is formed of the same material and by the same step as the first layer; and the second gate electrode is formed of the same material and by the same step as the second wire.

In any of the foregoing structures, side surfaces of the first wire and side surfaces of the second wire may form tapered shapes using the photo mask or the reticle each of which is provided with the diffraction grating pattern or with the auxiliary pattern formed of the semi-translucent film having the light intensity reducing function. In any of the foregoing structures, the first mask is formed to have at least one interior angle of 180° or more in a cross-section in a direction perpendicular to the insulating surface.

The present invention has a portion where wires intersect with each other (an overlapping portion) in which a lower wire has a two-layer structure and a first layer of the lower layer is wider than a second layer formed thereover. Therefore, a steep step is relieved and step coverage of an interlayer insulator deposited thereover can be improved. Accordingly, a breaking of an upper wire formed in an intersection portion over the lower wire with an interlayer insulator interposed therebetween can be decreased to improve yield. In addition, by forming a tapered portion in the lower wire, step coverage can be further improved.

In addition, since an edge of the first layer is wider than that of the second layer in the lower wire, when a contact hole is formed in edges of the first layer and the second layer, the first layer in the lower wire serves as an etching stopper. That is, even when a material easily etched is used for the second layer, the first layer serves as an etching stopper, thereby preventing unnecessary etching. In addition, even if a material with high contact resistance in accordance with a third wire (a contact wire) is used for the second layer, it is acceptable as long as a material with low contact resistance in accordance with the third wire is used for the first wire. By appropriately selecting materials, a wider range of materials can be used.

In addition, since the third wire is in contact with both the first layer and the second layer formed thereover and also with a side surface of the second layer, an area in which the lower wire and the third wire are in contact becomes larger, whereby the third wire with a favorable junction property can be formed.

In addition, conventionally a wire is formed to be wide in a contact hole forming portion. However, in the present invention, the first layer is formed to be wide without increasing the number of steps, so that the wire does not require an additional step to be widened. In a contact hole forming portion, an edge of the first wire is projected from an edge of the second wire, thereby forming the first wire longer than the second wire.

The present invention uses a photo mask or a reticle each of which is provided with a diffraction grating pattern or with an auxiliary pattern formed of a semi-translucent film having a light intensity reducing function, and therefore, the lower wire can be manufactured without increasing the number of manufacturing steps.

DETAILED DESCRIPTION OF THE INVENTION

Figure 1A:
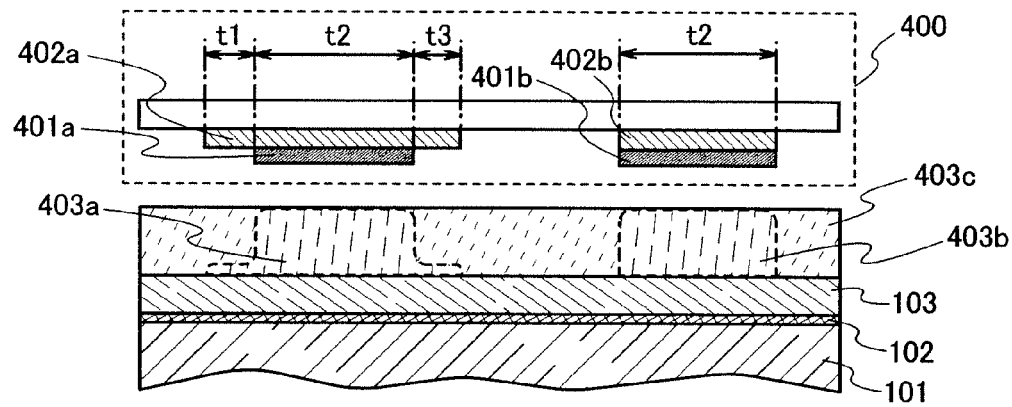
FIGS. 1A to 1E show cross-sectional views of a manufacturing process for a wire layer of the present invention.

Hereinafter, embodiment modes of the present invention are explained with reference to the drawings. However, the present invention is not limited to the following description. As is easily understood to a person skilled in the art, the mode and the detail of the present invention can be variously changed without departing from the spirit and the scope of the present invention. Thus, the present invention is not interpreted as being limited to the following description of the embodiment modes. Note that like portions in the different drawings are denoted by the like reference numerals when describing a structure of the present invention with reference to the drawings and repeated explanations thereof are omitted.

Embodiment Mode 1

In this embodiment mode, a manufacturing process for a semiconductor device having a lower wire with a two-layer structure is described. An example of a structure of the semiconductor device, in which the two-layer structured lower wire and an upper wire overlap each other with an insulating film therebetween is described with reference to FIGS. 1A to 1E.

First, a substrate 101 having an insulating surface is prepared. As the substrate 101 having an insulating surface, a translucent substrate can be used, such as a glass substrate, a crystallized glass substrate, or a plastic substrate. Besides, as long as the substrate 101 having an insulating surface has an insulating surface as the outermost layer or film, the substrate 101 having the insulating surface may be provided with a base film formed of an insulator, a semiconductor layer, or a conductive film.

Next, a first conductive layer 102 is formed over the substrate 101 having an insulating surface and a second conductive layer 103 is stacked thereover. The first conductive layer 102 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 30 to 50 nm.

The second conductive layer 103 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 200 to 600 nm.

Here, the first conductive layer 102 and the second conductive layer 103 are formed of different conductive materials so that the etching rates are different from each other in a subsequent etching step. The first conductive layer 102 is formed of tantalum nitride and the second conductive layer 103 is formed by a tungsten film.

Then, after a resist film 403 is applied over the entire surface of the second conductive layer 103, light exposure is performed using a mask shown in FIG. 1A. Here, the resist film with a thickness of 1.5 mm is applied, and a light exposure machine in which resolution is 1.5 m is used for the light exposure. Light used for the light exposure is an i-line (wavelength: 365 nm), and light exposure energy is selected from a range of 70 to 140 mJ/cm$^2$. In addition, the light is not limited to an i-line; light in which an i-line, a g-line (wavelength: 436 nm), and an h-line (wavelength: 405 nm) are mixed may also be used for the light exposure.

In this embodiment mode, a light exposure mask provided with an auxiliary pattern (a halftone film) formed of a semi-transparent film having a light intensity reducing function is used.

In FIG. 1A, the light exposure mask 400 has light shielding portions 401a and 401b formed of a metal film such as Cr and has portions provided with a semi-translucent film (also called a halftone film) (also called semi-translucent portions 402a and 402b) as an auxiliary pattern having a light intensity reducing function. In a cross-sectional view of the light exposure mask 400, the width of a portion in which the light shielding portion 401a and the semi-translucent portion 402a are overlapped or a portion in which the light shielding portion 401b and the semi-translucent portion 402b are overlapped is denoted by t2. The width of a portion in which only the semi-translucent portions 402a is provided is denoted by t1 or t3. That is, the width of a portion of the semi-translucent portion 402a which is not overlapped with the light shielding portion 401a is denoted by t1 or t3 Here, an example of using the semi-translucent film as a part of the exposure mask is described; however, a diffraction grating pattern may also be used.

When light exposure is performed to the resist film 403 by using the light exposure mask 400 shown in FIG. 1A, non-light-exposed regions 403a and 403b and a light exposed region 403c are formed. In the light exposure, the light exposed region 403c shown in FIG. 1A is formed by light that goes around the light shielding portions 401a and 401b or passes through the semi-translucent portions 402a and 402b.

Figure 1B:
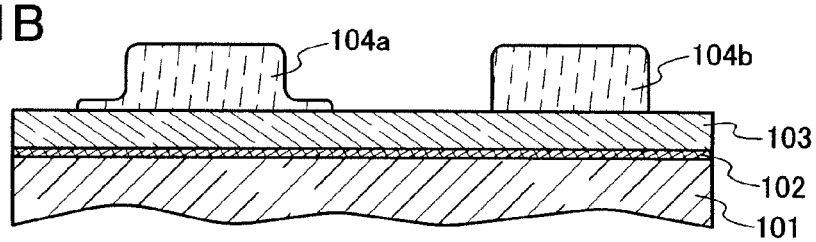

Then, development is performed to remove the light exposed region 403c, so that, as shown in FIG. 1B, a bilaterally symmetric resist pattern 104a having a thick region and thin regions thinner than the thick region on both sides and a resist pattern 104b having a thick region can be obtained over the second conductive layer 103. In the resist pattern 104a, which is bilaterally symmetric with respect to a line perpendicular to the substrate, the thickness of the resist film in the thin regions can be controlled by adjusting the light exposure energy. Note that although a bilaterally symmetric resist pattern is formed in this embodiment mode, a bilaterally asymmetric resist pattern may be formed.

In a resist pattern formed by using a light exposure mask provided with an auxiliary pattern (a halftone film) formed of a semi-transparent film having a light intensity reducing function, at least one part having an interior angle of 180° or more is provided in a cross-section of the resist pattern (a cross-section perpendicular to the substrate). In this embodiment mode, the resist pattern 104a formed by using the light exposure mask 400 has two portions each with an interior angle of 180° or more in the cross-section (the cross-section which is perpendicular to the substrate 101) thereof.

Then, etching of the second conductive layer 103 and the first conductive layer 102 is performed by dry etching using the resist patterns 104a and 104b as masks. As the etching gas, $CF_4$, $SF_6$, $Cl_2$, or $O_2$ is used. A dry etching apparatus using a high-density plasma source such as ECR (Electron Cyclotron Resonance) or ICP (Inductively Coupled Plasma) is used to improve the etching speed. Note that depending on the etching condition, the substrate 101 having an insulating surface is also etched and partially thinned. Therefore, an insulating film for being etched is preferably preformed as the outermost surface of the substrate 101 or over the substrate 101.

Figure 1C:
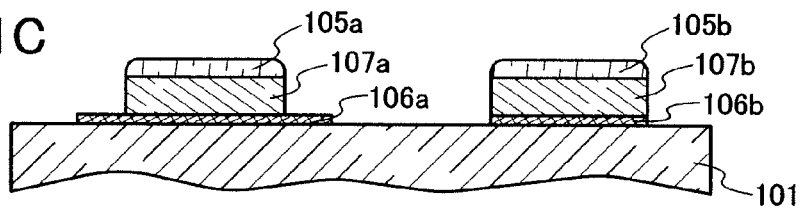

In this manner, as shown in FIG. 1C, a stacked-wire layer pattern of the lower wire formed by first wire layers 106a and 106b and second wire layers 107a and 107b are formed over the substrate 101. By etching, both side walls of the first wire layer 106a and 106b are exposed, and further, a region in the first wire layer 106a which is not overlapped with the second wire layer 107a is exposed. Note that the both side walls of the first wire layer 106a and the second wire layer 107a may form tapered shapes. Further, both side walls of the first wire layer 106b and the second wire layer 107b may also form tapered shapes.

Figure 1D:
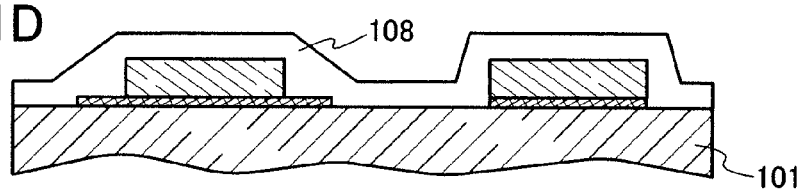

Next, an insulating film 108 is formed of silicon nitride as shown in FIG. 1D after removing resist patterns 105a and 105b. The insulating film may be formed of a translucent inorganic material (such as silicon oxide, silicon nitride, or silicon oxynitride) or an organic compound material with low-dielectric constant (such as a photosensitive or non-photosensitive organic resin material). In addition, the insulating film may also be formed using a material containing siloxane. Note that siloxane is a material including a skeleton structure formed by a bond of silicon (Si) and oxygen (O). As a substituent, an organic group including at least hydrogen (such as an alkyl group or aromatic hydrocarbon) is used. Alternatively, a fluoro group may also be used as the substituent. Further alternatively, both an organic group including at least hydrogen and a fluoro group may be used as the substituent. In this embodiment mode, a single-layer is formed as the insulating layer; however, a stacked-layer may be formed.

Figure 1E:
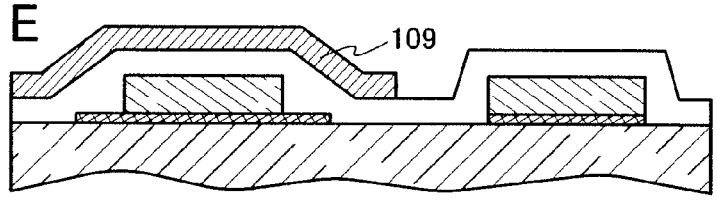

Subsequently, a third wire layer 109 to serve as the upper wire is formed as shown in FIG. 1E. The upper wire may be a single-layer or stacked-layer and a film of a metal element such as silver (Ag), gold (Au), copper (Cu), nickel (Ni), platinum (Pt), palladium (Pd), iridium (Ir), ruthenium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba); a film formed of an alloy material including the foregoing element as a main component (such as an alloy containing Al, carbon (C), and Ni, or an alloy containing Al, carbon (C), and Mo); or a stacked-film of the foregoing elements (such as a stacked-film of Mo, Al, and Mo; a stacked-film of Ti, Al, and Ti; or a stacked film of titanium nitride (TiN), Al, and Ti); a film formed of a compound material such as metal nitride; or the like. Note that the foregoing conductive film can be formed by a known film forming method such as sputtering. Note that the film thickness is 50 to 500 nm.

In this embodiment mode, a portion of the first wire layer 106a over which the third wire layer 109 lays is wider than the second wire layer 107a formed over the first wire layer 106a; thereby preventing a breaking of the third wire layer 109. Note that a portion of the first wire layer 106b over which the third wire layer 109 does not lay has the same width as that of the second wire layer 107b since a breaking is not required to be taken into consideration. That is, in a portion where wires are not overlapped with each other, the width of the wire is preferably narrow so as to realize miniaturization. Thus, the present invention can realize improvement in reliability and high integration.

Embodiment Mode 2

In this embodiment mode, another structure of Embodiment Mode 1 is described with reference to FIGS. 11A to 11E.

Figure 11A:
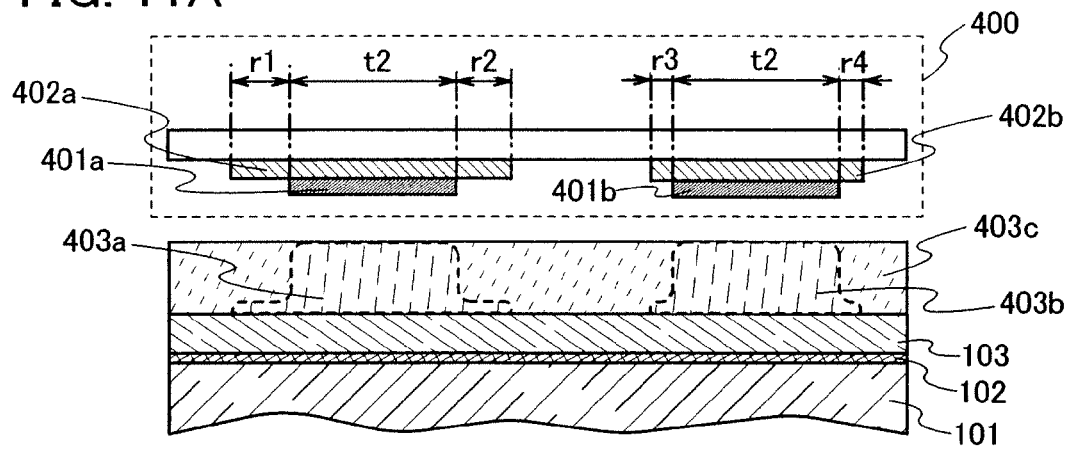
FIGS. 11A to 11E show cross-sectional views of a manufacturing process for a wire layer of the present invention.

First, the substrate 101 having an insulating surface is prepared as shown in FIG. 11A. As the substrate 101 having an insulating surface, a translucent substrate can be used, such as a glass substrate, a crystallized glass substrate, or a plastic substrate. Besides, as long as the substrate 101 having an insulating surface has an insulating surface as the outermost layer or film, the substrate 101 having an insulating surface may be provided with a base film formed of an insulator, a semiconductor layer, or a conductive film.

Next, the first conductive layer 102 is formed over the substrate 101 having an insulating surface and the second conductive layer 103 is stacked thereover. The first conductive layer 102 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 30 to 50 nm.

The second conductive layer 103 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 200 to 600 nm.

Here, the first conductive layer 102 and the second conductive layer 103 are formed of different conductive materials so that the etching rates are different from each other in a subsequent etching step. The first conductive layer 102 is formed of tantalum nitride and the second conductive layer 103 is formed by a tungsten film.

Then, after the resist film 403 is applied over the entire surface of the second conductive layer 103, light exposure is performed using a mask shown in FIG. 11A. Here, the resist film with a thickness of 1.5 μm is applied, and a light exposure machine in which resolution is 1.5 μm is used for the light exposure. Light used for the light exposure is an i-line (wavelength: 365 nm), and light exposure energy is selected from a range of 70 to 140 mJ/cm². In addition, the light is not limited to an i-line; light in which an i-line, a g-line (wavelength: 436 nm), and an h-line (wavelength: 405 nm) are mixed may also be used for the light exposure.

In this embodiment mode, a light exposure mask provided with an auxiliary pattern (a halftone film) formed of a semi-transparent film having a light intensity reducing function is used.

In FIG. 11A, the light exposure mask 400 has light shielding portions 401a and 401b formed of a metal film such as Cr and portions provided with a semi-translucent film (also called semi-translucent portions 402a and 402b) as an auxiliary pattern having a light intensity reducing function. In a cross-sectional view of the light exposure mask 400, the width of a portion in which the light shielding portion 401a and the semi-translucent portion 402a are overlapped or a portion in which the light shielding portion 401b and the semi-translucent portion 402b are overlapped is denoted by t2; the width of a portion in which only the semi-translucent portions 402a is provided or a portion in which only the semi-translucent portions 402b is provided is denoted by r1, r2, r3, or r4. Here, in order to form a bilaterally asymmetric resist pattern, r1 and r2, or r3 and r4 have the same width; however, r1 to r4 may have a different width from each other. Here, an example of using the semi-translucent film as a part of the light exposure mask is described; however, a diffraction grating pattern may also be used.

When light exposure is performed to the resist film 403 by using the light exposure mask 400 shown in FIG. 11A, the non-light-exposed regions 403a and 403b and the light exposed region 403c are formed in the resist film 403. In the light exposure, the light exposed region 403c shown in FIG. 11A is formed by light that goes around into the light shielding portions 401a and 401b or passes through the semi-translucent portions 402a and 402b.

Figure 11B:
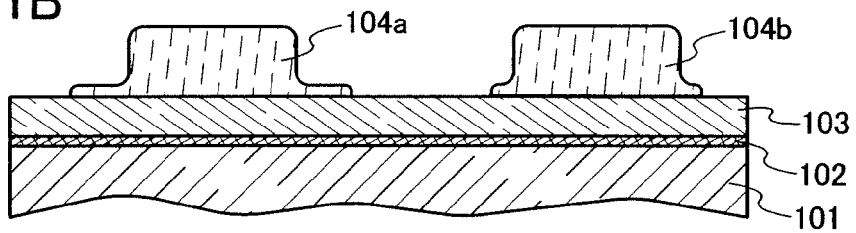

Then, development is performed to remove the light exposed region 403c, so that, as shown in FIG. 11B, bilaterally symmetric resist patterns 104a and 104b each having a thick region and thin regions thinner than the thick region on both sides can be obtained over the second conductive layer 103. In the resist pattern 104a, which is bilaterally symmetric with respect to a line perpendicular to the substrate, the thickness of the resist film in the thin regions can be controlled by adjusting the light exposure energy. Note that although a bilaterally symmetric resist pattern is formed in this embodiment mode, a bilaterally asymmetric resist pattern may be formed.

In a resist pattern formed by using an light exposure mask provided with an auxiliary pattern (a halftone film) formed of a semi-transparent film having a light intensity reducing function, at least one part having an interior angle of 180° or more is provided in a cross-section of the resist pattern (a cross-section perpendicular to the substrate). In this embodiment mode, the resist pattern 104a formed by using the light exposure mask 400 has two portions each with an interior angle of 180° or more in the cross-section (the cross-section which is perpendicular to the substrate 101) thereof.

Then, etching of the second conductive layer 103 and the first conductive layer 102 is performed by dry etching using the resist patterns 104a and 104b as masks. As the etching gas, $CF_4$, $SF_6$, $Cl_2$, or $O_2$ is used. A dry etching apparatus using a high-density plasma source such as ECR (Electron Cyclotron Resonance) or ICP (Inductively Coupled Plasma) is used to improve the etching speed. Note that depending on the etching condition, the substrate 101 having an insulating surface is also etched and partially thinned. Therefore, an insulating film for being etched is preferably preformed as the outer most surface of the substrate 101 or over the substrate 101.

Figure 11C:
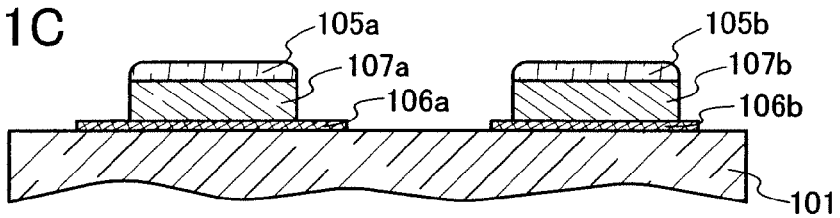

In this manner, as shown in FIG. 11C, the stacked-wire layer pattern of the lower wire formed by the first wire layers 106a and 106b and the second wire layers 107a and 107b are formed over the substrate 101. By etching, both side walls of the first wire layers 106a and 106b are exposed, and further, a region in the first wire layers 106a and 106b which is not overlapped with the second wire layer 107a and 107b is exposed. Note that the both side walls of the first wire layers 106a and 106b may form tapered shapes. Further, both side walls of the second wire layers 107a and 107b may also form tapered shapes.

Figure 11D:
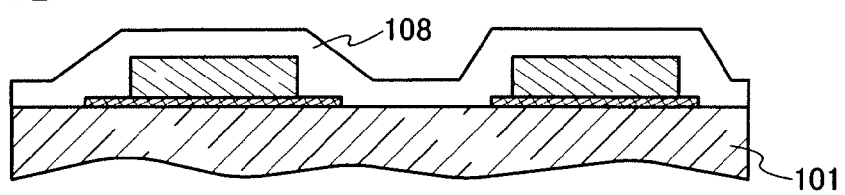

Next, the insulating film 108 is formed of silicon nitride as shown in FIG. 11D after removing the resist patterns 105a and 105b. The insulating film may be formed of a translucent inorganic material (such as silicon oxide, silicon nitride, or silicon oxynitride) or an organic compound material with low-dielectric constant (such as a photosensitive or non-photosensitive organic resin material). In addition, the insulating film may also be formed using a material containing siloxane. Note that siloxane is a material including a skeleton structure formed by a bond of silicon (Si) and oxygen (O). As a substituent, an organic group including at least hydrogen (such as an alkyl group or aromatic hydrocarbon) is used. Alternatively, a fluoro group may also be used as the substituent. Further alternatively, both an organic group including at least hydrogen and a fluoro group may be used as the substituent. In this embodiment mode, a single-layer is formed as the insulating layer; however, a stacked-layer may be formed.

Figure 11E:
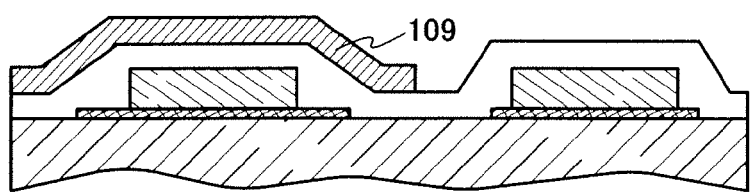

Subsequently, a third wire layer 109 to serve as the upper wire is formed as shown in FIG. 11E. The upper wire may be a single-layer or stacked-layer and a film of a metal element such as silver (Ag), gold (Au), copper (Cu), nickel (Ni), platinum (Pt), palladium (Pd), iridium (Ir), ruthenium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba); a film formed of an alloy material including the foregoing element as a main component (such as an alloy containing Al, carbon (C), and Ni, or an alloy containing Al, carbon (C), and Mo); or a stacked-film of the foregoing elements (such as a stacked-film of Mo, Al, and Mo; a stacked-film of Ti, Al, and Ti; or a stacked film of titanium nitride (TiN), Al, and Ti); a film formed of a compound material of metal nitride; or the like. Note that the foregoing conductive film can be formed by a known film forming method such as sputtering. Note that the film thickness is 50 to 500 nm.

In this embodiment mode, a portion of the first wire layer 106a over which the third wire layer 109 lays is wider than the second wire layer 107a and a difference between the widths of the second wire layer 107a and the first wire layer 106a is 1 µm. In addition, a portion of the first wire layer 106b over which the upper wire does not lay is wider than the second wire layer 107b and the difference between the widths of the second wire layer 107b and the first wire layer 106b is 0.5 µm.

That is, in a region where wires are overlapped with each other, a difference between the widths of the first layer and the second layer of the lower wire is set larger so as to prevent a breaking of the third wire layer 109 serving as the upper wire. On the other hand, in a region where wires are not overlapped with each other, the difference between the widths of the wires is set smaller than that of the region where the wires are overlapped with each other, thereby improving coverage of the insulating film 108.

Here, the width of the wire layer is changed at two points. However, the width of the wire may be differed at a plurality of points if needed. With a light exposure mask provided with an auxiliary pattern formed of a semi-translucent film having a light intensity reducing function, the first wire layer and the second wire layer can be formed at the same time to have a plurality of different widths and a plurality of differences between the widths of the wire layers. Needless to say, this embodiment mode and Embodiment Mode 1 can be combined.

Embodiment Mode 3

In this embodiment mode, a light exposure mask which is different from those of Embodiment Modes 1 and 2 is described with reference to FIGS. 12A to 12D.

In this embodiment mode, a light exposure mask including a semi-translucent portion formed by lines (also called non-opening portion) and spaces (also called opening portion), or rectangular patterns and spaces is explained with reference to FIGS. 12A to 12D.

Figure 12A:
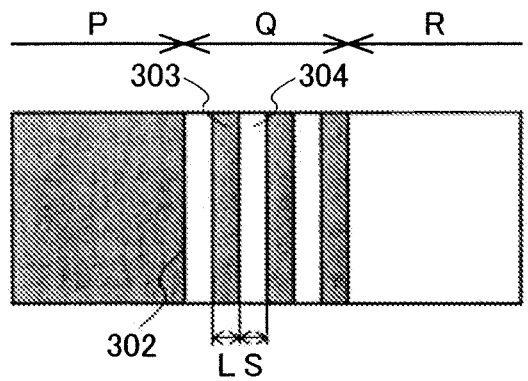
FIGS. 12A to 12D show structures of a light exposure mask of the present invention.
Figure 12B:
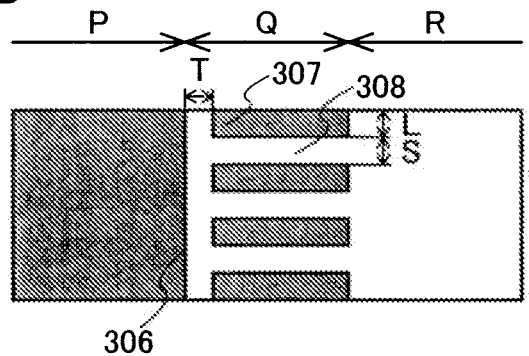
Figure 12C:
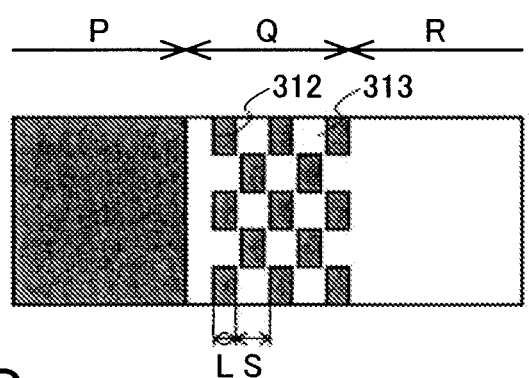
Figure 12D:
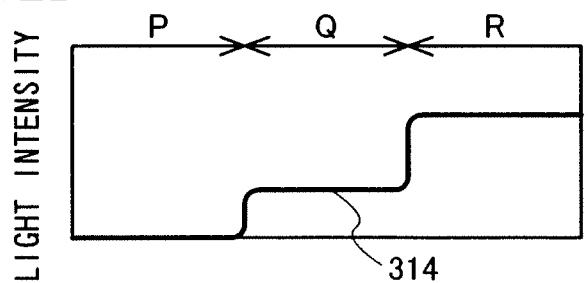

Specific examples of top views of light exposure masks are shown in FIGS. 12A to 12C. In addition, an example of light intensity distribution when using the light exposure mask is shown in FIG. 12D. Each of the light exposure masks shown in FIGS. 12A to 12C includes a light shielding portion P, a semi-translucent portion Q, and a translucent portion R. In the semi-translucent portion Q of the light exposure mask shown in FIG. 12A, lines 303 and spaces 304 are repeatedly provided in stripes (or, in slits), and the lines 303 and the spaces 304 are arranged parallel to an edge 302 of the light shielding portion P. In this semi-translucent portion, a width of each line 303 formed of a light shielding material is L and a width of each space between light shielding materials is S. A light exposure mask is used which satisfies conditional expressions: L=(a×b)×c and S=(a×b)×d, wherein L is the line width, S is the space width, a is the resolution of the light exposure apparatus, and 1/b (b≥1) is the projection magnification, and the coefficient c satisfies c≤0.8 and the coefficient d satisfies d≤0.7.

In specific, when a=1.5 μm and b=1, a combination of L/S=0.5 μm/0.5 μm, 0.75 μm/0.5 μm, 1.0 μm/0.5 μm, 0.75 μm/0.75 μm, or the like is used.

The lines 303 are formed of a light shielding material and can be formed of the same light shielding material as the light shielding portion P. The lines 303 are formed in rectangular shapes, but the shape is not limited thereto. It is acceptable as long as the lines have a constant width. For example, each line may have a shape with a round corner.

By using a light exposure mask satisfying the foregoing relation, the amount of exposure light transmitted through the semi-translucent portion is almost uniform on a surface to be exposed to the light, and a photoresist layer of a light exposure portion in the semi-translucent portion can be formed to have a thin and uniform thickness, thereby obtaining a desired pattern with high accuracy.

FIG. 12B shows another example. In the semi-translucent portion Q of a light exposure mask, lines 307 and spaces 308 are provided in stripes, and the lines 307 and the spaces 308 are arranged perpendicular to an edge 306 of the light shielding portion P. A light exposure mask is used which satisfies the foregoing conditional expressions of FIG. 12A, where L is the width of the line 307 and S is the width of the space 308 of the semi-translucent portion, a is the resolution of the light exposure apparatus, and 1/b (b≥1) is the projection magnification. The edge 306 of the light shielding portion P and edges of the lines 307 of the semi-translucent portion Q may be in contact with each other, or may be arranged with a distance T as shown. The distance T is required to be shorter than (a×b) that is the resolution a of the light exposure apparatus multiplied by the reciprocal b of the projection magnification. The light exposure mask of FIG. 12B can be similar to that of FIG. 12A in material, shape, and the like except for the arrangement of lines and spaces.

The lines and spaces of the semi-translucent portion Q may be in either direction shown in FIG. 12A or 12B. In addition, a combination of FIGS. 12A and 12B can also be used. Further, the lines and spaces of the semi-translucent portion Q may be arranged in an intermediate direction between the directions shown in FIGS. 12A and 12B, that is, obliquely with respect to an edge of the light-shielding portion P. Also in this case, the light exposure mask can be similar to that of FIG. 12A in material, shape, and the like except for arrangement of lines and spaces.

The semi-translucent portion Q may be provided with lines and spaces that are arranged in stripes as shown in FIG. 12A or 12B, or may be provided with another pattern. For example, the semi-translucent portion Q may be provided with rectangular patterns 312 formed of a light shielding material that are periodically arranged in a grid or geometrically as shown in FIG. 12C. In FIG. 12C, the width L of each rectangular pattern 312 in a short-side direction corresponds to the width L of each line. In addition, the width S of each space 313 in the short-side direction corresponds to the width S of each space. A light exposure mask is used which satisfies the foregoing conditional expressions of FIG. 12A, where L is the width of the rectangular pattern 312 and S is the width of the space 313, a is the resolution of the light exposure apparatus, and 1/b (b≥1) is the projection magnification. The rectangular patterns 312 are formed of a light shielding material and can be formed of the same light shielding material as the light shielding portion P.

The lines and spaces (or rectangular patterns and spaces) of the semi-translucent portion may be arranged periodically as shown in FIGS. 12A to 12C or non-periodically. When they are arranged non-periodically, it is acceptable as long as lines and spaces (or rectangular patterns and spaces) adjacent to each other satisfy the above condition.

By adjusting the width of each of lines and spaces (or rectangular patterns and spaces) within the range satisfying the above condition, the practical amount of exposure light can be changed and the thickness of a light-exposed resist after development can be adjusted.

Note that it is difficult to employ a negative-type resist as the resist used in this photolithography step; therefore, a pattern of the light exposure mask is premised on a positive-type resist. A projection-type light exposure apparatus can be used as the light exposure apparatus. A light exposure apparatus with a projection magnification of 1:1 or a reduced-projection light exposure apparatus with a projection magnification of 1/b can be used.

When the light exposure mask shown in each of FIGS. 12A to 12C is irradiated with exposure light, light intensity in the light shielding portion P is about zero, and light intensity in the translucent portion R is about 100%. On the other hand, light intensity in the semi-translucent portion can be adjusted in the range of 10 to 70%, and an example of its typical light intensity distribution is shown as light intensity distribution 314 in FIG. 12D. The light intensity in the semi-translucent portion Q of the light exposure mask can be adjusted by adjusting the line width L and the space width S (or the width L of the rectangular pattern in the short-side direction and the space width S in the short-side direction).

In the light exposure mask shown in each of FIGS. 12A to 12C, the relation between the resolution a of the light exposure apparatus, the projection magnification 1/b (b≥1), and the line width L (or the width L of the rectangular pattern in the short-side direction) preferably satisfies L<(2a/3)×b.

In addition, in the light exposure mask satisfying the above relation, it is particularly effective to arrange the semi-translucent portion Q on a side of the light shielding portion P, in other words, to arrange the semi-translucent portion Q between the light shielding portion P and the translucent portion R.

The light exposure masks in this embodiment mode can be used in stead of the light exposure mask employed in Embodiment Mode 1 or 2. In other steps, Embodiment Modes 1 and 2 are referred to and explanation thereof is omitted.

Embodiment Mode 4

In this embodiment mode, a structure of the present invention which is formed using a light exposure mask provided with a diffraction grating pattern or with an auxiliary pattern formed of a semi-translucent film having a light intensity reducing function of any of Embodiment Modes 1 to 3 is described with reference to the drawings.

Figure 2A:
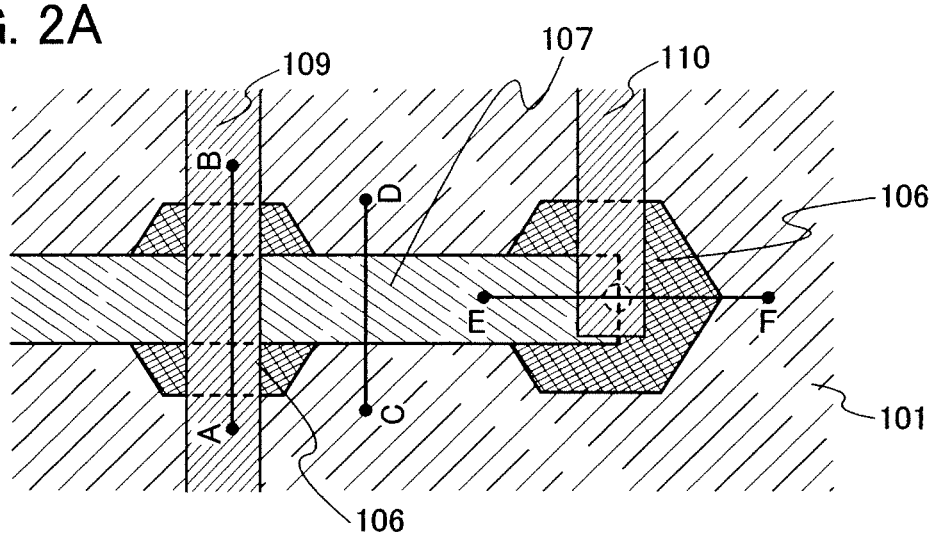
FIG. 2A shows a top view and 2B to 2D show cross-sectional views of a wire layer of the present invention.
Figure 10A:
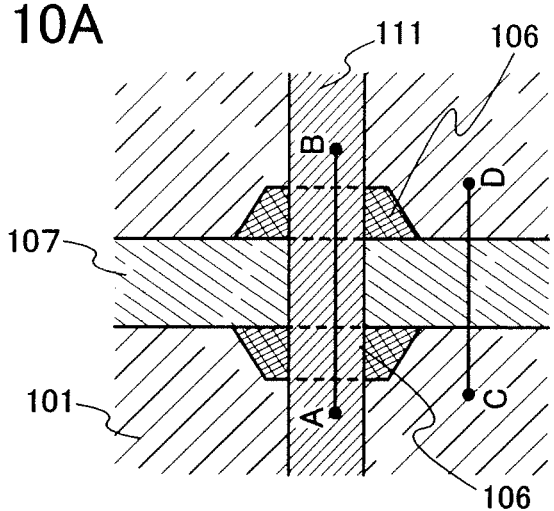
FIG. 10A shows a top view and 10B and 10C show cross-sectional views of a manufacturing process for a wire layer of the present invention.

FIG. 2A shows a structure where the first wire layer 106 and the second wire layer 107 serving as a lower layer are formed over the substrate 101 according to the steps of the foregoing embodiment mode. In addition, the third wire layer 109 serving as an upper wire and the conductive layer 110 serving as a contact wire are formed thereover with the insulating film 108 interposed therebetween. FIG. 10A shows a structure in which the first wire layer 106 and the second wire layer 107 are formed over the substrate 101 and a third wire layer 111 serving as an upper layer is formed thereover without interposing an insulating film.

Figure 2B:
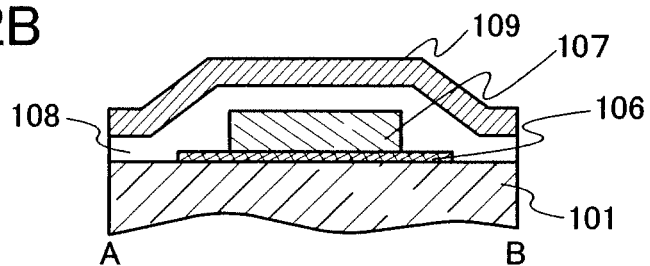
Figure 2C:
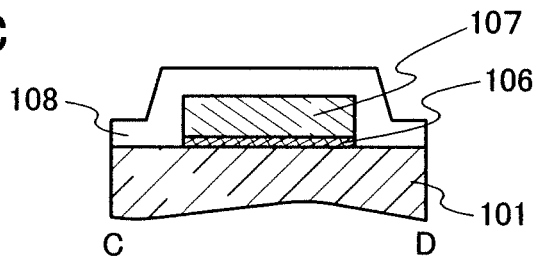
Figure 2D:
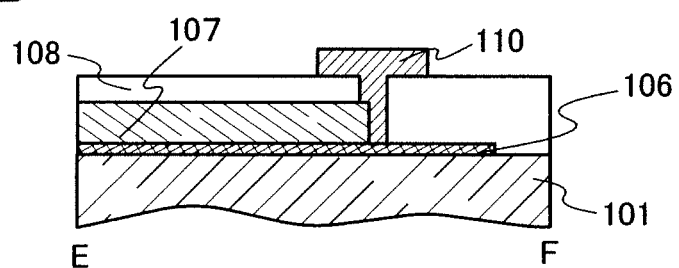
Figure 10B:
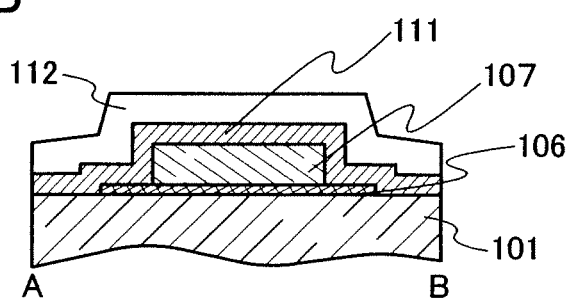
Figure 10C:
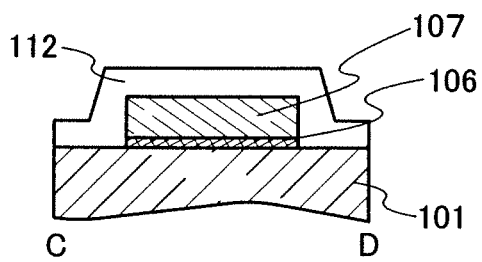

Note that cross-sectional views of FIGS. 2B, 2C, and 2D are cross-sectional views taken along lines A-B, C-D, and E-F in FIG. 2A, respectively. Cross-sectional views of FIGS. 10B and 10C are cross-sectional views taken along lines A-B and C-D in FIG. 2A, respectively. In addition, a structure of this embodiment mode shown in FIGS. 2B and 2C are the same as that shown in FIG. 1E formed in Embodiment Mode 1.

The cross-sectional view A-B of FIG. 2B shows the first wire layer 106 and the second wire layer 107 overlapping with the third wire layer 109 to serve as the upper wire with the interlayer film (the insulating film 108) interposed therebetween The first wire layer 106 and the second wire layer 107 are formed over the substrate 101. The first wire layer 106 is formed to be wider than the second wire layer 107. In addition, the insulating film 108 is formed over the second wire layer 107 and the third wire layer 109 is formed over the insulating film 108.

Then, a portion of the first wire layer 106 and the second wire layer 107 over which the third wire layer 109 does not lay is shown in FIG. 2C. The widths of the first wire layer 106 and the second wire layer 107 formed over the substrate 101 are the same since the upper wire does not lay thereover. The insulating film 108 is formed over the second wire layer 107.

With the structure described above, a portion of the first wire layer 106 over which the third wire layer 109 lays is wider than the second wire layer 107. By forming the first layer in the lower wire wider, a breaking of the third wire layer 109 serving as the upper wire can be prevented. Note that a portion of the first wire layer 106 over which the third wire layer 109 does not lay has the width same as that of the second wire layer 107 since a breaking is not taken into consideration. That is, when wires are not overlapped with each other, the width of the wire is preferably narrow so as to realize miniaturization. Thus, the present invention can realize improvement in reliability and high integration.

FIG. 2D shows the conductive layer 110 serving as a contact wire which is in contact with a top surface of the first wire layer 106, and a top surface and an edge of the second wire layer 107. In this embodiment mode, the first wire layer 106 and the second wire layer 107 are formed by using a light exposure mask provided with a diffraction grating pattern or with an auxiliary pattern formed of a semi-translucent film having a light intensity reducing function in accordance with the steps shown in the foregoing embodiment modes. The first wire layer 106 is formed to be longer than the second wire layer 107.

Subsequently, the insulating film 108 is formed over the first wire layer 106 and the second wire layer 107. Then, a contact hole is formed to be in contact with the top surface of the first wire layer 106 and the top surface and the edge of the second wire layer 107.

The contact hole can be formed by etching with a resist mask (not shown) until the first wire layer 106, the second wire layer 107, and the edge of the second wire layer 107 are exposed. Either wet etching or dry etching can be employed. The etching may be performed once or a plurality of times depending on the condition. When the etching is performed a plurality of times, both the wet etching and the dry etching may be performed.

Then, a conductive layer is formed in the contact hole to have a desired shape, thereby forming the conductive layer 110 serving as a contact wire.

By the foregoing steps, the conductive layer 110 serving as a contact wire is formed to be in contact with the top surface of the first wire layer 106 and the top surface and the edge of the second wire layer 107, whereby poor contact can be prevented. In addition, if metal nitride is formed as the first wire layer when forming a contact hole, the first wire layer 106 serves as an etching stopper, thereby preventing unnecessary etching.

The cross-sectional view A-B of FIG. 10B shows the first wire layer 106 and the second wire layer 107 over which the third wire layer 111 to serve as an upper wire lays without an interlayer film (an insulating film) interposed therebetween.

The first wire layer 106 and the second wire layer 107 are formed over the substrate 101. The first wire layer 106 is wider than the second wire layer 107. In addition, the third wire layer 111 to serve as the upper wire is formed over the second wire layer 107 and an insulating film 112 is formed over the third wire layer 111.

Then, the first wire layer 106 and the second wire layer 107 over which the third wire layer 111 does not lay are shown in FIG. 10C. The widths of the first wire layer 106 and the second wire layer 107 formed over the substrate 101 are the same since the upper wire does not lay thereover. The insulating film 108 is formed over the second wire layer 107.

With the structure described above, a portion of the first wire layer 106 over which the third wire layer 111 lays is wider than the second wire layer 107. By forming the first layer in the lower wire wider, a breaking of the third wire layer 111 serving as the upper wire can be prevented. Note that a portion of the first wire layer 106 over which the third wire layer 111 does not lay has the width same as the second wire layer 107 since a breaking is not taken into consideration. That is, when wires are not overlapped with each other, the width of the wire is preferably narrow so as to realize miniaturization. Thus, the present invention can realize improvement in reliability and high integration.

Note that in the structure described above, the lower wire and the upper wire can be connected electrically without an opening portion and an interlayer film interposed therebetween. Therefore, further improvement in reliability and higher integration can be realized.

This embodiment mode can be freely combined with Embodiment Modes 1 to 3.

Embodiment Mode 5

In this embodiment mode, an example of a liquid crystal display device using the present invention is described with reference to the drawings.

Figure 3A:
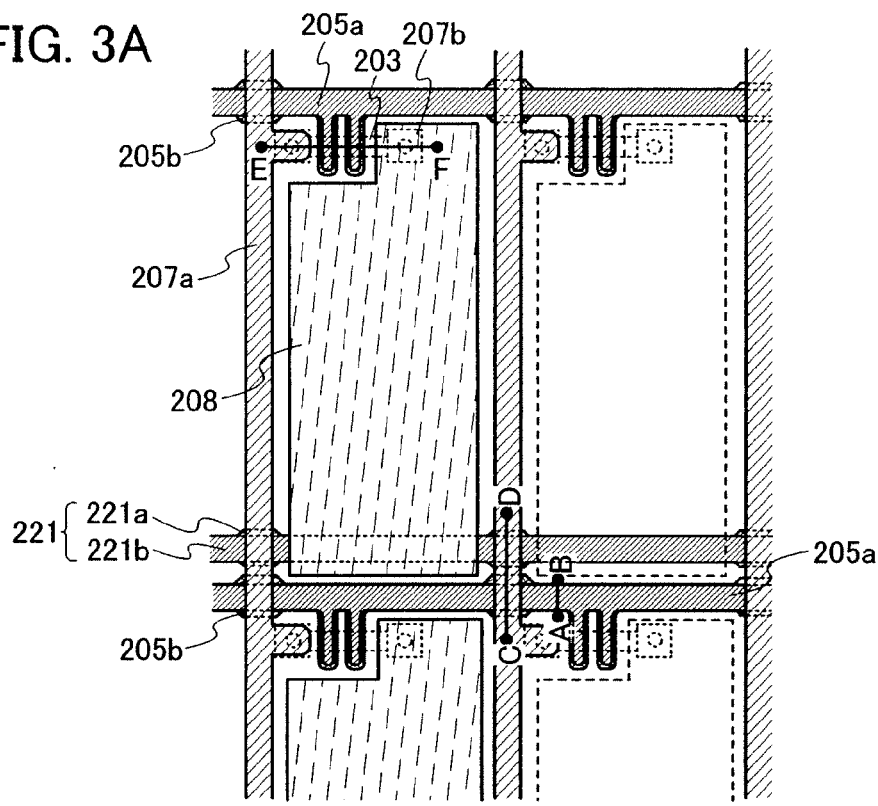
FIG. 3A shows a top view and 3B to 3D show cross-sectional views of a semiconductor device of the present invention.
Figure 3B:
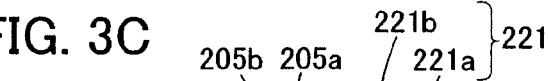
Figure 3C:
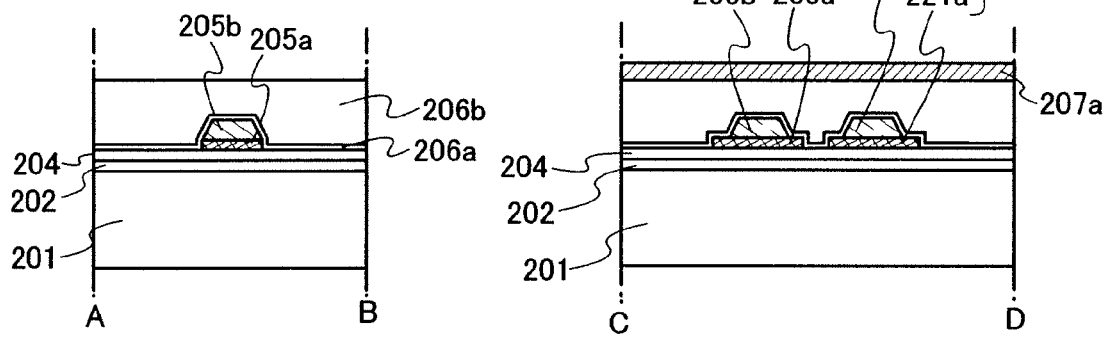
Figure 3D:
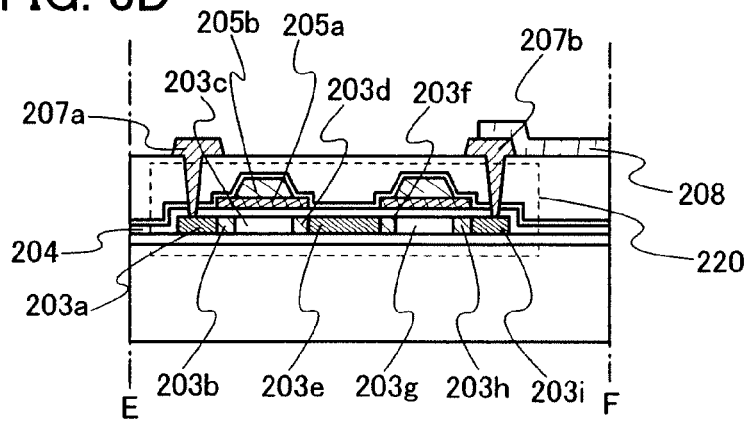

FIG. 3A is an enlarged top view of a part of a pixel portion. Note that FIG. 3A shows a pixel electrode in process and a left pixel has a formed pixel electrode while a right pixel does not. Note that cross-sectional views of FIGS. 3B, 3C, and 3D are cross-sectional views taken along lines A-B, C-D, and E-F in FIG. 3A, respectively. Besides, a capacitor wire 221 is formed and a storage capacitor is formed of the capacitor wire 221 and a pixel electrode 208 which overlaps the capacitor wire 221 by using an interlayer insulating film 206 as a dielectric.

In this embodiment mode, a top gate TFT manufactured in accordance with the present invention is described with reference to FIG. 3D.

As shown in FIG. 3D, a TFT 220 is formed over the substrate 201 and the pixel electrode 208 is electrically connected to a high-concentration impurity region 203i in the TFT 220 via a drain wire 207b. Note that a counter electrode is formed over the pixel electrode 208 with a liquid crystal layer (not shown) interposed therebetween. A manufacturing process of the top gate TFT shown in FIG. 3D is hereinafter described.

First, a substrate 201 is prepared. As the substrate 201, a quartz substrate or a plastic substrate can be used in addition to a glass substrate. When using a glass substrate, the glass substrate may be pretreated with heat at a temperature which is lower than a glass strain point by about 10 to 20° C.

Then, a base film 202 is formed of an insulating substance such as silicon oxide, silicon nitride, or silicon oxynitride over the substrate 201 by a known film forming method such as plasma CVD or sputtering. Note that the base film may be a single-film or a multilayer-film in which a plurality of films is stacked. By forming the base film 202 between the substrate 201 and the TFT 220, diffusion of impurity from the substrate 201 to the TFT 220 can be prevented.

Then, a semiconductor layer 203 is formed over the base film 202 as follows: a semiconductor film having an amorphous structure is formed by a known method (such as sputtering, LPCVD, or plasma CVD), a crystalline semiconductor film that is crystallized by heat treatment is formed, a resist film is formed over the crystalline semiconductor film, and then using a first resist mask obtained by light exposure and development, the crystalline semiconductor film is patterned into a desired shape.

The semiconductor layer 203 is formed to have a thickness of 25 to 80 nm (preferably, 30 to 70 nm). A material for the crystalline semiconductor film is not limited, but silicon, a silicon germanium (SiGe) alloy, or the like is preferably used.

As the foregoing heat treatment, a heating furnace, laser irradiation, irradiation with light emitted from a lamp instead of laser light (hereinafter referred to as lamp annealing), or a combination thereof can be used.

Alternatively, the crystalline semiconductor film may be formed by thermal crystallization in which the heat treatment is performed after adding a catalyst such as nickel. Note that when the crystalline semiconductor film is obtained by crystallization by thermal crystallization using a catalyst such as nickel, it is preferable to perform gettering treatment for removing the catalyst such as nickel after the crystallization.

When the crystalline semiconductor film is formed by laser crystallization, a continuous wave laser beam (CW laser beam) or a pulsed laser beam can be used. As a laser beam that can be used here, a laser beam emitted from one or more kinds of a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$ or polycrystalline (ceramic) YAG; Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal grain having a large diameter can be obtained by irradiation with the fundamental wave of the foregoing laser beam or any of a second harmonic to a fourth harmonic of the fundamental wave. For example, the second harmonic (532 nm) or the third harmonic (355 nm) of a Nd:YVO$_4$ laser (the fundamental wave: 1064 nm) can be used. A power density of the laser is required to be about 0.01 to 100 MW/cm$^2$ (preferably, 0.1 to 10 MW/cm$^2$). A scanning rate is set to about 10 to 2000 cm/sec for irradiation.

Note that a laser using, as a medium, single crystal YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser are capable of continuous oscillation. Alternatively, it can be pulsed at a repetition rate of 10 MHz or more by performing Q-switch operation, mode locking, or the like. When a laser beam is oscillated at a repetition rate of 10 MHz or more, the semiconductor film is irradiated with the following pulsed laser beam after being melted by the laser beam and before being solidified. Therefore, unlike in the case of using a pulsed laser having a low repetition rate, the interface between the solid phase and the liquid phase can be moved continuously in the semiconductor film, so that crystal grains grown continuously in the scanning direction can be obtained.

When ceramic (polycrystal) is used as a medium, the medium can be formed into a desired shape in a short time at low cost. In the case of using a single crystal, a columnar medium having a diameter of several mm and a length of several tens of mm is generally used. However, in the case of using ceramic, a larger medium can be formed.

A concentration of a dopant such as Nd or Yb in a medium, which directly contributes to light emission, cannot be changed largely either in a single crystal or a polycrystal. Therefore, there is certain limitation on improvement in laser output by increasing the concentration. However, the use of ceramic can significantly increase the size of the medium compared with when a single crystal is used, and thus, significant improvement in output can be expected.

Furthermore, in the case of using ceramic, a medium having a parallelepiped shape or a rectangular parallelepiped shape can be easily formed. When a medium having such a shape is used and emitted light zigzags inside the medium, an oscillation optical path can be extended. Therefore, the light is amplified largely and can be emitted with high output. In addition, since a laser beam emitted from a medium having such a shape has a quadrangular cross-sectional shape at emission, it has an advantage over a circular beam in being shaped into a linear beam. By shaping the laser beam emitted as described above using an optical system, a linear beam having a length of 1 mm or less on a shorter side and a length of several mm to several m on a longer side can be easily obtained. Further, by uniformly irradiating the medium with excited light, the linear beam has a uniform energy distribution in a long-side direction.

By irradiating the semiconductor film with this linear beam, the entire surface of the semiconductor film can be annealed more uniformly. When uniform annealing is required to opposite ends of the linear beam, a device of providing slits on the opposite ends so as to block a portion where energy is decayed or the like device is necessary.

When the linear beam with uniform intensity obtained as described above is used for annealing the semiconductor film and an electronic appliance is manufactured using this semiconductor film, characteristics of the electronic appliance are favorable and uniform.

Subsequently, if necessary, doping with a small amount of impurity element (boron or phosphorus) is performed to the semiconductor layer to control a threshold value of a TFT. Here, an ion doping method in which diborane ($B_2H_6$) is not mass-separated but excited by plasma is used.

Then, after the first resist mask is removed, an oxide film is removed with an etchant containing hydrofluoric acid and the surface of the semiconductor layer is cleaned at the same time. Thereafter, a gate insulating film 204 covering the semiconductor layer is formed. The gate insulating film 204 is formed using plasma CVD, sputtering, or thermal oxidation to have a thickness of 1 to 200 nm and preferably 70 to 120 nm. As the gate insulating film 204, a film formed of an insulating film such as a silicon oxide film, a silicon nitride film, or a silicon oxynitride film is formed. Here, a silicon oxynitride film (where composition ratio is: Si=32%, O=59%, N=7%, and H=2%) is formed by plasma CVD to have a thickness of 115 nm.

In addition, after forming a substrate, an insulating layer as a base film, a semiconductor layer, a gate insulating layer, an interlayer insulating layer, or the like, the surface of the substrate, the insulating layer as a base film, the semiconductor layer, the gate insulating layer, the interlayer insulating layer, or the like may be oxidized or nitrided by performing oxidization or nitridation with plasma treatment. When plasma treatment is used for oxidizing or nitriding the semiconductor layer or the insulating layer, the surface of the semiconductor layer or the insulating layer is modified, and a denser insulating film than an insulating film formed by CVD or sputtering can be formed. Accordingly, defects such as a pin hole can be suppressed, and characteristics or the like of a semiconductor device can be improved. In addition, plasma treatment as described above can also be applied to a gate electrode layer, a source electrode layer, a drain electrode layer, a wire layer, and the like, and a nitride film or an oxide film can be formed by performing nitridation or oxidation.

Note that when a film is oxidized by plasma treatment, the plasma treatment is performed under an oxygen atmosphere (for example, under an atmosphere containing oxygen ($O_2$) and a rare gas (including at least one of He, Ne, Ar, Kr, and Xe), under an atmosphere containing oxygen, hydrogen ($H_2$), and a rare gas, or under an atmosphere containing dinitrogen monoxide and a rare gas). On the other hand, when the film is nitrided by plasma treatment, the plasma treatment is performed under a nitrogen atmosphere (for example, under an atmosphere containing nitrogen ($N_2$) and a rare gas (containing at least one of He, Ne, Ar, Kr, and Xe), under an atmosphere containing nitrogen, hydrogen, and a rare gas, or under an atmosphere containing $NH_3$ and a rare gas). As the rare gas, for example, Ar can be used. Alternatively, a mixed gas of Ar and Kr may be used. Consequently, the insulating film that is formed by plasma treatment contains a rare gas used for the plasma treatment (which contains at least one of He, Ne, Ar, Kr, and Xe), and the insulating film contains Ar in the case of using Ar.

In addition, when plasma treatment is performed to the second gate insulating film 204, the plasma treatment is performed under an atmosphere of the foregoing gas with an electron density of $1 \times 10^{11}$ $cm^{-3}$ or higher and an electron temperature of plasma of 1.5 eV or lower.

More specifically, the plasma treatment is performed with an electron density of $1 \times 10^{11}$ to $1 \times 10^{13}$ $cm^3$ and an electron temperature of plasma of 0.5 to 1.5 eV. Since electron density of plasma is high and electron temperature in the vicinity of an object to be treated formed over the substrate (here, the gate insulating film 204) is low, damage by plasma to the object to be treated can be prevented. Further, since an electron density of plasma is as high as $1 \times 10^{11}$ $cm^{-3}$ or higher, an oxide film or a nitride film, which is formed by oxidizing or nitriding the object to be treated using the plasma treatment, has excellent uniformity in thickness or the like and a dense film quality as compared with a film formed by CVD, sputtering, or the like. Moreover, since an electron temperature of plasma is as low as 1.5 eV or lower, oxidizing or nitriding treatment can be performed at a lower temperature than that of conventional plasma treatment or thermal oxidation. For example, oxidizing or nitriding treatment can be sufficiently performed even when performing plasma treatment at a temperature lower than a strain point of a glass substrate by 100° C. or more. Note that a high frequency such as a microwave (2.45 GHz) can be used as a frequency for forming plasma.

Next, a first conductive layer 205*a* and a first conductive layer 205*b* to serve as a gate electrode and a gate wire are formed (at the same time, a first capacitor wire 221*a* and a second capacitor wire 221*b* are formed in FIG. 3C). The stacked-layer is not limited to include two layers of the first conductive layer and the second conductive layer, and a stacked-layer may include three or more layers.

The first conductive layer 205*a* is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 30 to 50 nm.

The second conductive layer 205*b* is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 200 to 600 nm.

Here, the first conductive layer 205*a* and the second conductive layer 205*b* are formed of different wire materials so that the etching rates are different from each other in a subsequent etching step. The first conductive layer 205*a* is formed of tantalum nitride and the second conductive layer 205*b* is formed by a tungsten film. As the first conductive layer 205*a* and the second conductive layer 205*b*, a forming step in foregoing Embodiment Modes are referred to and description thereof is omitted.

Next, an impurity imparting one conductivity type is added to the semiconductor film 203. Here, phosphorus (or As) is used as an ion of the impurity imparting one conductivity type, and an n-channel TFT is manufactured. By using the conductive stacked-layer pattern, an LDD region, a source region, and a drain region can be formed in a self-alignment manner without forming a sidewall.

When performing doping treatment for forming a source region and a drain region outside the gate electrode, an ion of the impurity imparting one conductivity type may be added to the semiconductor film 203 using the conductive stacked-layer pattern as a mask to form high-concentration impurity regions 203*a*, 203*e*, and 203*i*. As for doping conditions for forming the source region and the drain region, an acceleration voltage of 30 kV or lower is employed. An impurity concentration of each of the high-concentration impurity regions 203a, 203e, and 203i is set to be $1 \times 10^{19}$ to $5 \times 10^{21}/cm^3$ (the peak value by SIMS measurement).

In addition, when performing doping treatment for forming an LDD region which is overlapped with the gate electrode, an ion of an impurity imparting one conductivity type may be added to the semiconductor film 203 through a region of the first conductive layer 205a which is not overlapped with the second conductive layer to form low concentration impurity regions 203b, 203d, 203f, and 203h. As for doping conditions, an accelerating voltage of 50 kV or more is needed here, although doping conditions depend on the thicknesses of the second insulating layer and the first conductive layer. An impurity concentration of each of the low concentration impurity regions 203b, 203d, 203f, and 203h is set to be $1 \times 10^{16}$ to $5 \times 10^{18}/cm^3$ (the peak value by SIMS measurement).

With the forgoing doping treatment, channel formation regions 203c and 203g are formed. Note that the order of doping is not particularly limited, and doping treatment for forming a source region and a drain region may be performed before doping treatment for forming an LDD region. Alternatively, doping treatment for forming an LDD region may be performed before doping treatment for forming a source region and a drain region.

Although an example of separately performing doping treatment in two steps to form the impurity regions having different concentrations is described here, impurity regions having different concentrations may be formed by single doping treatment by adjusting treatment conditions.

In addition, although an example of removing the resist pattern before doping is described here, the resist pattern may alternatively be removed after doping treatment. When doping is performed with a resist pattern left, doping can be performed while protecting the surface of the second conductive layer with the resist pattern.

Note that, in the case of performing the foregoing doping treatment, the semiconductor layer in a position overlapped with the second conductive layer is a region to which the ion of the impurity imparting one conductivity type is not added and serves as a channel formation region of a TFT to be formed later. In this embodiment mode, a double-gate TFT having two channel formation regions is described; however, it is not limited to a double-gate TFT, and a multi-gate TFT having a plurality of channel formation regions or a single-gate TFT may also be employed.

In addition, the conductive stacked-layer pattern (the first conductive layer 205a and the second conductive layer 205b) in a portion intersecting with the semiconductor film 203 serves as a gate electrode. A $L_{ov}$ region is formed which is a region of the first conductive layer 205a, which is not overlapped with the second conductive layer 205b. Note that the $L_{ov}$ region refers to a region in a low concentration region overlapping with a gate electrode. The necessary length of the $L_{ov}$ region may be determined in accordance with a type or an application of a circuit including a TFT, and a photomask or etching conditions may be set based on the length.

A first interlayer insulating film 206a is formed to cover the gate insulating film 204, the first conductive layer 205a, and the second semiconductor layer 205b. The first interlayer insulating film 206a is formed of silicon nitride. Then, the impurity added to the semiconductor layer is activated and hydrogenated.

Next, a second interlayer insulating film 206b is formed of a translucent inorganic material (such as silicon oxide, silicon nitride, or silicon oxynitride) or an organic compound material having a low dielectric constant (a photosensitive or non-photosensitive organic resin material). Alternatively, the second interlayer insulating film may be formed using a material containing siloxane. Note that siloxane is a material including a skeleton structure formed by a bond of silicon (Si) and oxygen (O). As a substituent, an organic group including at least hydrogen (for example, an alkyl group or aromatic hydrocarbon) is used. A fluoro group may be used as the substituent, or an organic group containing at least hydrogen and a fluoro group may be used as the substituent.

Note that the second interlayer insulating film 206b serves as a planarizing film. The top surface thereof is preferably planarized or made smooth. In this embodiment mode, the planarizing film is combined with a structure of the present invention, so that a breaking can be prevented further effectively.

Then, contact holes are formed through the first interlayer insulating film 206a and the second interlayer insulating film 206b which reach the high-concentration impurity regions 203a and 203i. The contact hole can be formed by etching with a resist mask until the high-concentration impurity regions 203a and 203i are exposed. Either wet etching or dry etching can be employed. The etching may be performed once or a plurality of times depending on the condition. When the etching is performed a plurality of times, both the wet etching and the dry etching may be performed.

Next, a conductive film is formed in the contact holes and processed into a predetermined shape to form a source wire 207a and a drain wire 207b. The source wire 207a and a drain wire 207b are preferably formed to have a stacked-layer structure in which a low resistance material such as aluminum (Al) and a high-melting-point metal material such as titanium (Ti) or molybdenum (Mo) are combined. As an example, a stacked-layer structure of titanium (Ti) and aluminum (Al) and a stacked-layer structure of molybdenum (Mo) and aluminum (Al) are given.

In addition, a pixel electrode 208 is electrically connected to the drain wire 207b. The pixel electrode 208 is a translucent conductive film or a reflecting conductive film. As a material for a translucent conductive film, indium tin oxide (ITO), zinc oxide (ZnO), indium zinc oxide (IZO), gallium doped zinc oxide (GZO), indium tin oxide containing silicon oxide (ITSO), or the like can be given. As a material for a reflecting conductive film, a metal such as aluminum (Al), titanium (Ti), silver (Ag), or tantalum (Ta); a metal material of the metal containing nitrogen at a concentration in stoichiometric proportion or less; nitride of the metal such as titanium nitride (TiN) or tantalum nitride (TaN); or the like can be given. The pixel electrode 208 can be formed by a method appropriately chosen from sputtering, vapor deposition, CVD, coating, or the like.

By the foregoing steps, a top-gate TFT and the pixel electrode are formed over the substrate 201. In this embodiment mode, a top-gate TFT is formed; however, it is not limited to this structure and a bottom-gate TFT can also be employed.

Note that a TFT substrate for a liquid crystal display panel can be formed by forming alignment films interposing a liquid crystal layer (not shown), a counter electrode, and a counter substrate over the pixel electrode 208. TFT substrates in FIGS. 3B and 3C are also formed at the same time by the foregoing steps.

With the foregoing steps, the width of the gate wire can be appropriately adjusted without increasing the number of steps. When the width of the gate wire is selectively adjusted, a breaking of the gate wire can be prevented.

Figure 4:
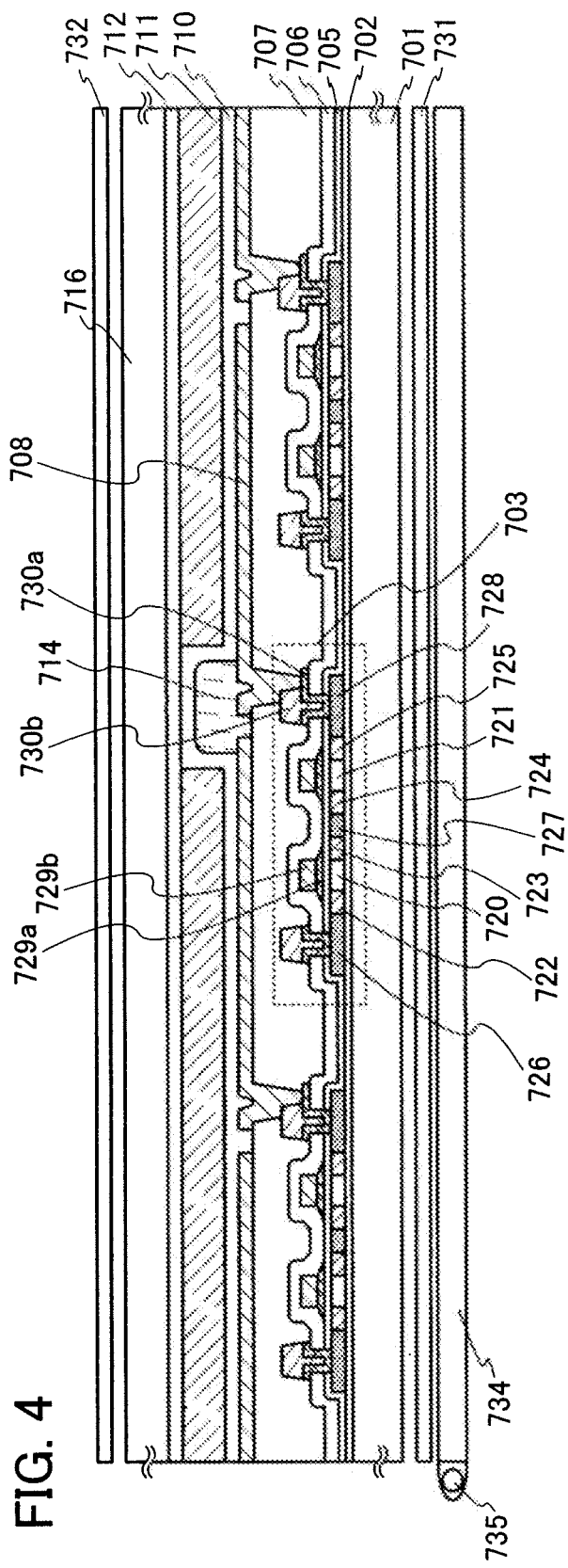
FIG. 4 shows a cross-sectional view of a semiconductor device of the present invention.

Hereinafter, an example of a liquid crystal display device in which a pixel portion, a driver circuit, and a terminal portion are formed over one substrate is shown with reference to FIG. 4. FIG. 4 is a cross-sectional view of a liquid crystal panel without a color filter.

This embodiment mode employs a field sequential driving method in which an optical shutter is conducted by a liquid crystal panel without a color filter and a backlight of three colors of RGB is blinked at high speed. According to a field sequential method, color display is achieved by continuous time additive color mixing utilizing a temporal resolution limit of a human eye.

Three double gate TFTs 703 are provided over a first substrate 701 where a base film 702 is provided. These TFTs are n-channel TFTs each having channel formation regions 720 and 721, low concentration impurity regions 722 to 725, source or drain regions 726 to 728, a gate insulating film 705, and a gate electrode which has two layers including a tapered lower layer 729a and an upper layer 729b.

In addition, an interlayer insulating film 706 and a planarizing insulating film 707 are formed over the gate insulating film 705 and the gate electrode which has the tapered lower layer 729a and the upper layer 729b (that is, to cover the TFTs 703).

Each first conductive layer 730a and second conductive wire 730b to serve as a drain wire or a source wire of the TFT 703 have two-layer structures. As a material for the wire, silver (Ag), aluminum (Al), gold (Au), or copper (Cu), an alloy of these metals, or the like is used. Here, a stacked-layer wire of aluminum and titanium sequentially stacked over the substrate is used. The first conductive layer 730a and the second conductive layer 730b to serve as a drain wire or a source wire in a TFT preferably have tapered shapes in consideration of the coverage of the interlayer insulating film.

The pixel electrode 708 can be formed by a transparent conductive film formed of ITO (indium tin oxide), ITSO (indium tin oxide containing silicon oxide obtained by sputtering using a target of ITO which contains silicon oxide at 2 to 10 wt %), indium oxide zinc oxide (IZO) in which zinc oxide (ZnO) is mixed into indium oxide containing silicon oxide at 2 to 20 atomic %, ATO (antimony tin oxide) containing silicon oxide, or the like.

The pixel electrode 708 is formed to be in contact with an edge of the second conductive layer 730b, specifically, with a top surface of the first conductive layer 730a, and a top surface and a side surface of the second conductive layer 730b. Since the pixel electrode 708 is formed to be in contact with the two wire layers, poor contact can be prevented. In addition, in forming a contact hole, the first conductive layer 730a serves as an etching stopper, which prevents unnecessary etching.

A pillar spacer 714 contains resin and keeps a distance between the substrates constant. Therefore, the pillar spacers 714 are provided at uniform intervals. For higher speed response, the distance between the substrates is preferably 2 jtm or shorter and a height of the pillar spacer 714 is appropriately adjusted. When the screen size is as small as 2 inch or less on a side, the pillar spacers are not necessarily provided. The distance between the substrates may be appropriately adjusted only with a gap material such as a filler to be mixed into the sealing material.

Further, an alignment film 710 for covering the pillar spacer 714 and the pixel electrode 708 is provided. An alignment film 712 is also provided to a second substrate 716 to serve as a counter substrate, and the first substrate 701 and the second substrate 716 are pasted with a sealing material (not shown).

The space between the first substrate 701 and the second substrate 716 is filled with a liquid crystal material 711. The substrates may be pasted to each other by dropping the liquid crystal material 711 under low pressure so that a bubble does not enter with the sealing material having a closed pattern provided. Alternatively, a dip method (pumping method) may be employed in which after providing a seal pattern having an opening portion and pasting the TFT substrates to each other, the liquid crystal is injected using capillary phenomenon.

A liquid crystal panel in this embodiment mode has a so-called n cell structure and uses an OCB (optically compensated bend) display mode. The n cell structure is a structure in which liquid crystal molecules are orientated in such a way that the pretilt angles of the liquid crystal molecules are in a plane symmetric relation to a center plane between the active matrix substrate and the counter substrate. The orientation state of the n cell structure is spray orientation when voltage is not applied to the substrates, and changed to bend orientation when voltage is applied. When the voltage is further applied, the liquid crystal molecules of the bend orientation are orientated perpendicular to the both substrates so that light can pass therethrough. In the OCB mode, response speed gets about 10 times higher than that of a conventional TN mode.

Further, the liquid crystal panel is sandwiched between a pair of optical films (a polarizing plate, a retardation film, or the like) 731 and 732. In addition, in the display using the OCB mode, a biaxial retardation film is preferably used to compensate the viewing angle dependence of the retardation three-dimensionally.

An LED 735 of three colors of RGB is used as a backlight for a liquid crystal panel shown in FIG. 4. Light from the LED 735 is led by a light-guide plate 734. In the field sequential driving method, the LEDs of R, G, and B are sequentially turned on in a TR period, a TG period, and a TB period of an LED lighting period, respectively. In a lighting period (TR) of a red LED, a video signal (R1) corresponding to red is supplied to the liquid crystal panel, and a red image for one screen is written in the liquid crystal panel. In a lighting period (TG) of a green LED, video data (G1) corresponding to green is supplied to the liquid crystal panel and a green image for one screen is written in the liquid crystal panel. In a lighting period (TB) of a blue LED, video data (B1) corresponding to blue is supplied to the liquid crystal display device, and a blue image for one screen is written in the liquid crystal display device. One frame is formed by writing these three images.

This embodiment mode is combined with the present invention, so that the width of the wire can be appropriately adjusted without increasing the number of steps. When the width of the wire is selectively adjusted, a breaking of the wire layer can be prevented. In addition, poor connection of the pixel electrode 708 with the first conductive layer 730a and the second conductive layer 730b can be prevented. Therefore, according to the present invention, a liquid crystal display device with high driving performance and reliability can be manufactured.

This embodiment mode can be freely combined with Embodiment Modes 1 to 4.

Embodiment Mode 6

In this embodiment mode, an example of a display panel structure formed according to the present invention is described.

Figure 5A:
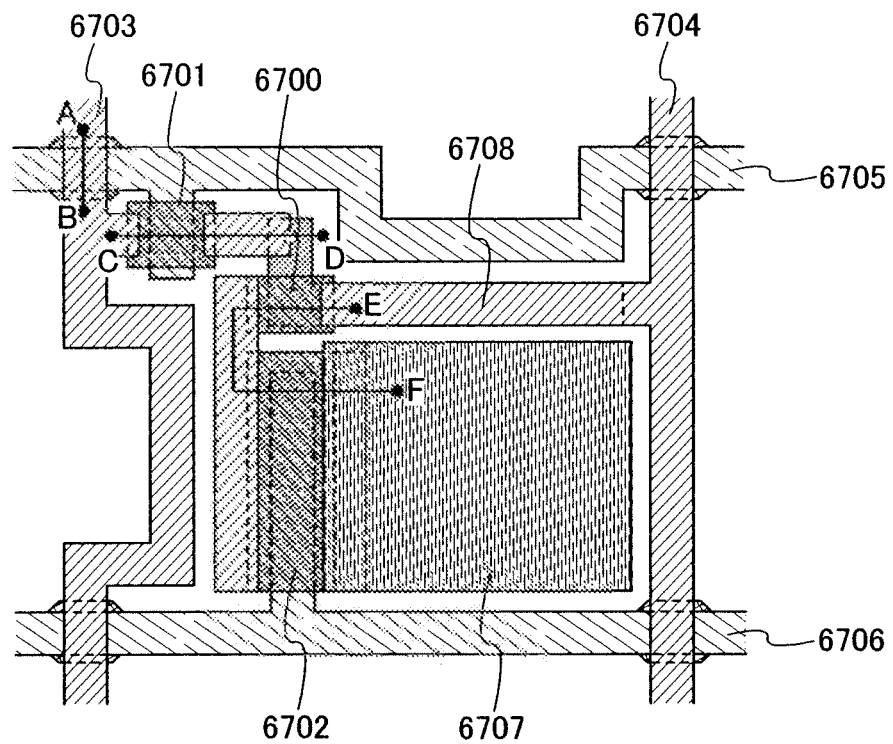
FIG. 5A shows a top view and 5B shows an equivalent circuit of a semiconductor device of the present invention.
Figure 5B:
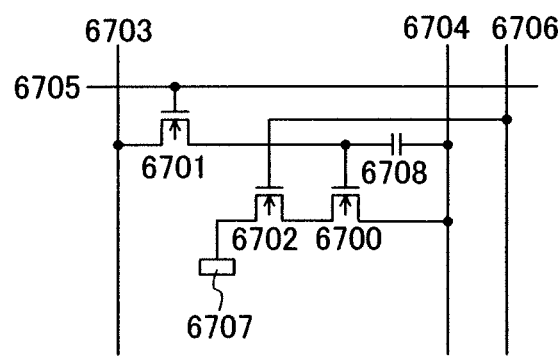

FIG. 5A shows a top view of a pixel of an EL display panel manufactured using inverted staggered TFTs (a first TFT 6700, a second TFT 6701, and a third TFT 6702). FIG. 5B shows a circuit diagram corresponding to the top view. In a pixel portion of the EL display panel, each pixel is provided with an EL element 6707 and the first TFT 6700 for driving which controls the light emission of the EL element 6707, the second TFT 6701 which controls on-off (switching) of the first TFT 6701, and a third TFT 6702 for driving which controls current supplied to the EL element.

The first TFT 6700 is connected to a pixel electrode provided under the EL element 6707 through the third TFT 6702 and is operated to control light emission of the EL element 6707. The second TFT 6701 controls the operation of the first TFT 6700 in response to signals of a scan line 6705 serving also as a gate electrode of the second TFT 6701 and a signal line 6703, and on-off of the first TFT 6700 can be controlled. The gate electrode of the first TFT 6700 is connected to the second TFT 6701, and power is supplied from a power source line 6704 to the pixel electrode side in response to on-off of the gate. Further, corresponding to the operation of the EL element whose emission luminance changes according to the amount of current flow, the third TFT for current control which is connected to a fixed power source line 6706 is provided; thus, constant current is supplied to the EL element 6707.

The EL element 6707 has a structure in which an organic compound containing layer (hereinafter, referred to as an EL layer) is interposed between a pair of electrodes (an anode and a cathode). An organic compound contained in the organic compound containing layer exhibits either light emission while returning to a ground state from an excited singlet state (fluorescence) or light emission while returning to a ground state from an excited triplet state (phosphorescence), or both exhibits light emission while returning to a ground state from an excited singlet state (fluorescence) and light emission while returning to a ground state from an excited triplet state (phosphorescence).

A low molecular organic light emitting material, an intermediate molecular organic light emitting material (an organic light emitting material which does not sublime and which has 20 or less molecules or has a molecule chain of 10 µm long at most), or a high molecular organic light emitting material may be used as an organic compound contained in the EL layer. The EL layer may be formed with a single layer, or may be formed by stacking a plurality of layers having different functions. In the case of stacking a plurality of layers, a hole injection layer, a hole transport layer, a light emitting layer, an electron injection layer, an electron transport layer, and a hole or electron block layer may be appropriately used in combination. A hole injection layer and a hole transport layer are formed of materials with high hole mobility and holes can be injected from an electrode. The two functions can be merged to form one layer (a hole injection transport layer). The same goes for the case of an electron injection transport layer.

Figure 6A:
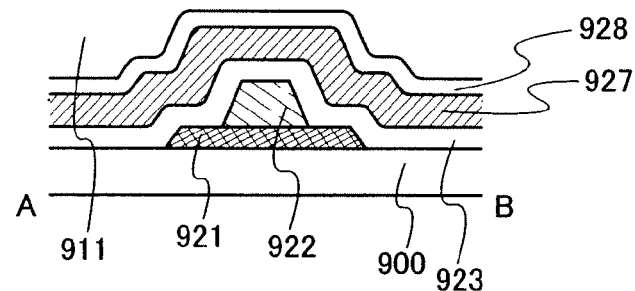
FIGS. 6A and 6B show cross-sectional views of a semiconductor device of the present invention.
Figure 6B:
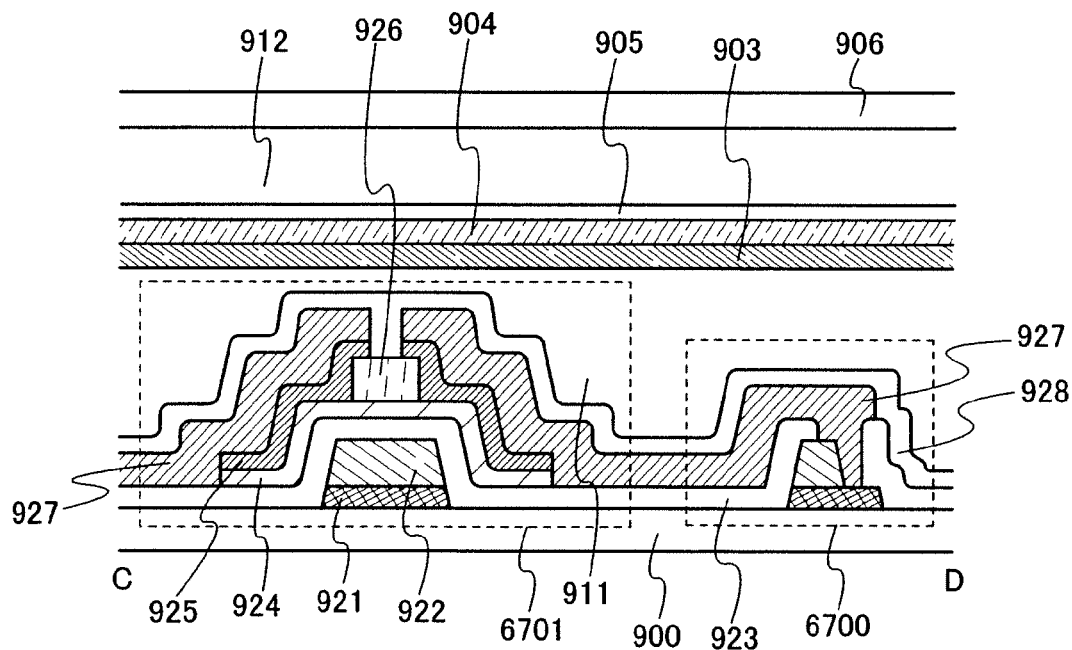
Figure 7:
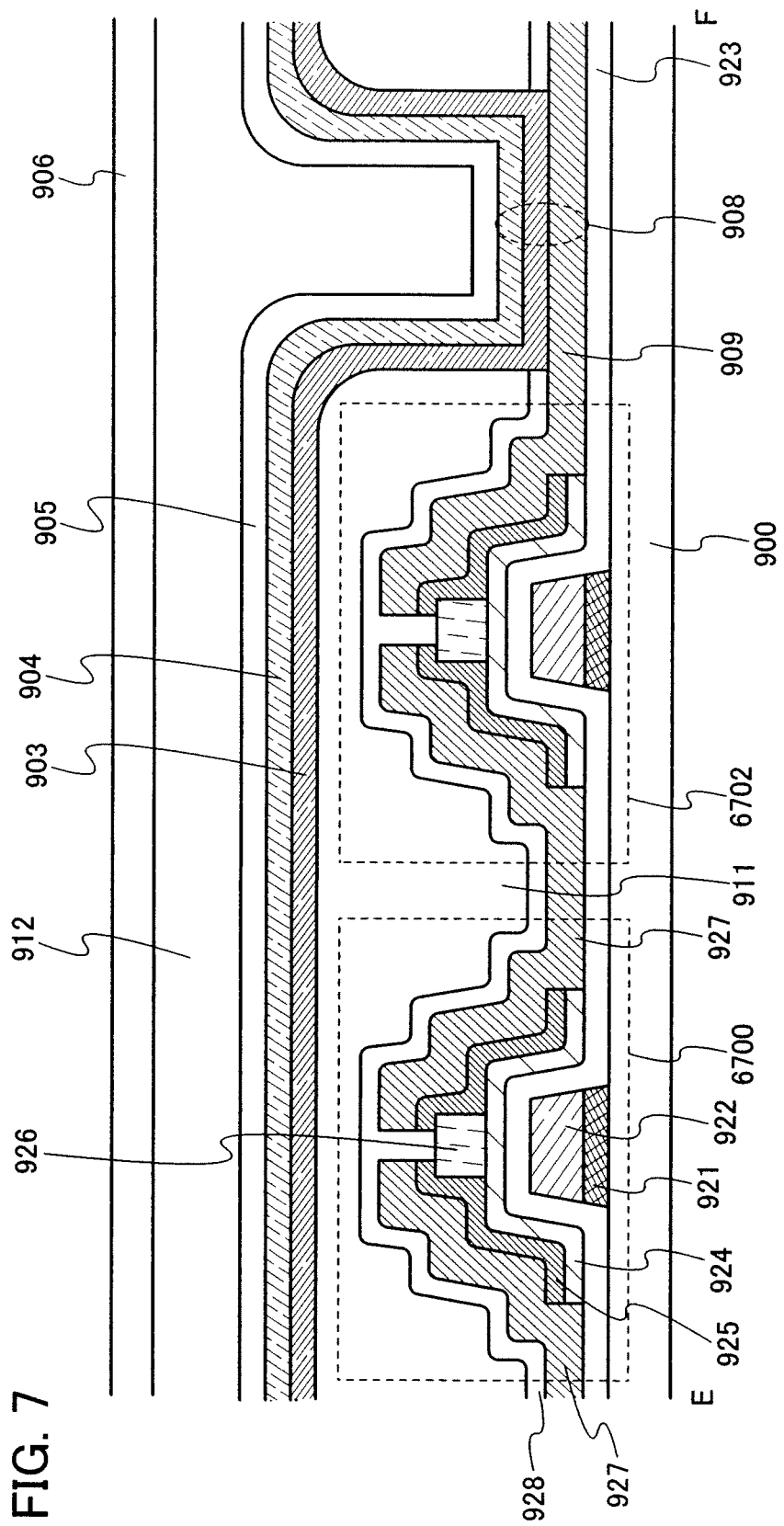
FIG. 7 shows a cross-sectional view of a semiconductor device of the present invention.

FIGS. 6A and 6B show cross-sectional views along lines A-B and C-D in FIG. 5A. FIG. 7 is a cross-sectional view along a line E-F in FIG. 5A. An active matrix EL display panel in which a light emitting element 908 is formed between a substrate 900 provided with the first TFT 6700, the second TFT 6701, the third TFT 6702, and the like; and a sealing substrate 906 is shown. The both sectional views of FIGS. 6B and 7 include the first TFT 6700. The first TFT 6700 is connected to a pixel electrode 909 through the second TFT 6701. An insulator 911 (referred to as an embankment, a partition wall, a bank, or the like) is provided over the pixel electrode 909 (anode), and a light emitting layer 903 and a counter electrode 904 are formed thereover; thus, the light emitting element 908 is formed. A passivation film 905 is formed over the light emitting element 908 and the light emitting element 908 is sealed with the sealing substrate 906 and a sealant. The space between the passivation film 905 and the sealing substrate 906 is filled with an insulator 912.

The insulators 911 and 912 may use a film formed of one selected from silicon nitride, silicon oxide, silicon nitride oxide, aluminum nitride, aluminum oxynitride, aluminum nitride oxide, aluminum oxide, diamond like carbon (DLC), and a carbon nitride film (CN); or a mixture thereof.

As another insulating material, one or more materials selected from polyimide, acrylic, benzocyclobutene, and polyamide may be used. Alternatively, a material (typically, a siloxane based polymer) in which a skeletal structure is formed by a bond of silicon (Si) and oxygen (O) and includes an organic group containing at least hydrogen (such as an alkyl group or aromatic hydrocarbon) as a substituent may be used. In addition, a fluoro group may be used as the substituent. Alternatively, a fluoro group and an organic group including at least hydrogen may be used as the substituent. In the case where light is released from the sealing substrate 906 (top emission type) side, a translucent material is required for the insulator 912.

Each of FIGS. 5A to 7 shows only one pixel; however, pixels having EL elements corresponding to R (red), G (green), and B (blue) may be combined to display multiple colors. All the colors may use light emission generated while returning to a ground state from an excited singlet state (fluorescence), or all the colors may use light emission generated while returning to a ground state from an excited triplet state (phosphorescence). Alternatively, the light emission may be combined as one color may be fluorescence (or phosphorescence) and the other two colors may be phosphorescence (or fluorescence). Phosphorescence may be used for only R and fluorescence may be used for G and B. For example, a copper phthalocyanine (CuPc) film may be formed to have a thickness of 20 nm as a hole injection layer and a tris-8-quinolinolato aluminum complex ($Alq_3$) film may be formed thereover to have a thickness of 70 nm as a light emitting layer. Colors of light emission can be controlled by adding fluorescent dye such as quinacridone, perylene, or DCM 1 to $Alq_3$.

The passivation film 905 can be formed of another insulating material such as silicon nitride, silicon oxide, silicon oxynitride, aluminum nitride, aluminum oxynitride, aluminum oxide, diamond like carbon, or carbon nitride. Alternatively, a material (typically, a siloxane based polymer) in which a skeletal structure is formed by a bond of silicon (Si) and oxygen (O) and includes an organic group containing at least hydrogen (such as an alkyl group or aromatic hydrocarbon) as a substituent may be used. In addition, a fluoro group may be used as the substituent. Alternatively, a fluoro group and an organic group including at least hydrogen may be used as the substituent.

The present invention can be applied to a dual emission light emitting display panel in which light is released from opposite sides of a light emitting display panel, or to a one side light emitting display panel. In the case where light is released from only the counter electrode 904 (a top emission type) side, the pixel electrode 909 is a reflective conductive film corresponding to an anode. A conductive film having high work function such as platinum (Pt) or gold (Au) is used to serve as the anode. Since those metals are expensive, a pixel electrode may be used in which the metals are stacked over an appropriate conductive film such as an aluminum film or a tungsten film, so that platinum or gold is exposed at least on the outermost surface. The counter electrode 904 is a thin (preferably 10 to 50 nm) conductive film and formed of a material containing an element having low work function which belongs to Group 1 or Group 2 of the periodic table (for example, Al, Mg, Ag, Li, Ca, or alloys thereof such as MgAg, MgAgAl, MgIn, LiAl, LiFAl, $CaF_2$, or $Ca_3N_2$) to serve as a cathode. An oxide conductive film (typically, an ITO film) is formed and stacked over the counter electrode 904. In this case, the light emitted from the light emitting element is reflected by the pixel electrode 909 and released from the sealing substrate 906 through the counter electrode 904.

In the case where light is released from only the side of the pixel electrode 909 (bottom emission type), a transparent conductive film is used for the pixel electrode 909 corresponding to an anode. The transparent conductive film can be formed of a compound of indium oxide and tin oxide, a compound of indium oxide and zinc oxide, zinc oxide, tin oxide, or indium oxide. The counter electrode 904 is preferably a conductive film (film thickness of 50 to 200 nm) formed of Al, Mg, Ag, Li, or Ca or an alloy thereof such as MgAg, MgIn, or AlLi. In this case, light emitted from the light emitting element 908 is released from the substrate 900 side through the pixel electrode 909.

In the case of a dual emission type, in which light is released from the both pixel electrode 909 side and the counter electrode 904 side, a transparent conductive film is used for the pixel electrode 909 corresponding to an anode. The transparent conductive film may be a film formed of ITO, ITSO, IZO, ZnO, or the like. The counter electrode 904 is a thin (preferably 10 to 50 nm) conductive film so that light can transmit therethrough and uses a material containing an element having low metal work function which belongs to Group 1 or Group 2 of the periodic table (for example, Al, Mg, Ag, Li, Ca, or an alloy thereof such as MgAg, MgAgAl, MgIn, LiAl, LiFAl, $CaF_2$, or $Ca_3N_2$) to serve as a cathode. A transparent oxide conductive film (typically, an ITO film or an ITSO film) is stacked over the counter electrode 904. In this case, the light emitted from the light emitting element 908 is released from both the substrate 900 side and the sealing substrate 906 side.

As to the EL display panel described above, the TFT can be manufactured according to the present invention; thus, the number of steps can be reduced and the manufacturing cost can be reduced. In particular, in forming a contact hole 6709 for connecting the first TFT 6700 and the second TFT 6701, further reduction in number of steps can be attempted as well as improvement in reliability by applying the present invention. In this embodiment mode, an example of using an inverted staggered TFT for a liquid crystal display panel has been described; however, the present invention can be similarly applied in the case of using a top gate TFT or staggered TFT.

Next, a manufacturing method for an inverted staggered TFT having a bottom gate structure is described.

As shown in FIGS. 6A to 7, a stacked-layer of a first conductive layer 921 and a second conductive layer 922 is formed over the substrate 900. Note that a base insulating film is formed over the substrate 900. As the base insulating film, an insulating film such as a silicon oxide film, a silicon nitride film, or a silicon oxide film containing nitrogen is preferably formed. The substrate 900 can be a plastic substrate with heat resistance which can resist a temperature of a process in this manufacturing step. Alternatively, an alkali-free glass substrate may be used. In addition, in the case of manufacturing a reflective liquid crystal display device, a semiconductor substrate such as single crystal silicon, a metal substrate such as stainless steel, a ceramic substrate with an insulating layer provided to the surface thereof may be used.

The first conductive layer 921 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 30 to 50 nm.

The second conductive layer 922 is formed of a high-melting-point metal such as tungsten (W), chromium (Cr), tantalum (Ta), tantalum nitride (TaN), or molybdenum (Mo); or an alloy or compound containing a high-melting-point metal as a main component, to have a thickness of 200 to 600 nm.

Here, the first conductive layer 921 and the second conductive layer 922 are formed of different wire materials so that the etching rates are different from each other in a subsequent etching step. The first conductive layer 921 is formed of tantalum nitride and the second conductive layer 922 is formed by a tungsten film.

Then, after a resist film is applied over the whole surface of the second conductive layer 922, light exposure is performed by using a light exposure mask similarity to the step described in the foregoing embodiment modes. In this embodiment mode, manufacturing steps of the foregoing embodiment modes are referred to and explanations thereof are omitted.

Thus, a gate electrode and a gate wire are formed by the first conductive layer 921 and the second conductive layer 922 over the substrate 101. In this embodiment mode, the gate electrode and the gate wire are formed by using a light exposure mask provided with a diffraction grating pattern or with an auxiliary pattern formed of a semi-translucent film having a light intensity reducing function; therefore, the first conductive layer 921 and the second conductive layer 922 having the two-layer structure are formed without increasing the number of steps.

Next, a first insulating film 923 serving as a gate insulating film is formed over the first conductive layer 921 and the second conductive layer 922. The first insulating film 923 to serve as a gate insulating film is formed by a thin film forming method such as plasma CVD or sputtering to have a single layer or stacked-layer structure of an insulating film containing silicon nitride, silicon oxide, or other silicon. In addition, a gate insulating film preferably has a stacked-layer structure of a silicon nitride film (silicon nitride oxide film), a silicon oxide film, and a silicon nitride film (silicon nitride oxide film). In such a structure, since the gate electrode is in contact with a silicon nitride film, deterioration due to oxidation can be prevented.

Then, a semiconductor film is formed over the first insulating film 923. As the semiconductor film, a film having any state selected from an amorphous semiconductor, a microcrystalline semiconductor, and a crystalline semiconductor is used. In any case, a main component is silicon, silicon germanium (SiGe), or the like and the film thickness thereof is preferably 10 to 100 nm, more preferably, 20 to 60 nm.

A crystalline semiconductor film can be formed by crystallizing an amorphous semiconductor film or a microcrystalline semiconductor with heat or laser irradiation. Alternatively, a crystalline semiconductor film may be formed directly.

In addition, a crystalline semiconductor film may be formed by adding a metal catalyst such as titanium (Ti), nickel (Ni), tungsten (W), molybdenum (Mo), cobalt (Co), zirconium (Zr), tantalum (Ta), vanadium (V), niobium (Nb), chromium (Cr), platinum (Pt), palladium (Pd), and the like over an amorphous semiconductor film and heating. Note that when forming a crystalline semiconductor film by this method, the metal catalyst is preferably removed in a subsequent step. As the method for removing the catalyst, a method is given in which an impurity (specifically, argon, phosphorus, or a rare gas) is added to a part of the crystalline semiconductor film and heated so that the catalyst element is moved to the region to which the impurity is added. Alternatively, a method is given in which a semiconductor film containing the foregoing impurity is formed over the crystalline semiconductor film and heated so that the catalyst element is moved to the semiconductor film containing the foregoing impurity.

Here, the semiconductor film to serve as a first semiconductor region 924 is formed using an amorphous semiconductor film, which is suited for mass production line. By using an amorphous semiconductor film, a conventionally existing production line can be employed, which leads to reduction in cost for equipment.

Next, an insulating film to serve as a second insulating film 926 is formed over the semiconductor film to serve as the first semiconductor region 924, and then, a mask (not shown) is formed over the insulating film to serve as the second insulating film 926. Here, an insulating film of a single layer is used which is formed of any of silicon oxide ($SiO_x$), silicon nitride ($SiN_x$), silicon oxynitride ($SiO_xN_y$) (x>y), silicon nitride oxide ($SiN_xO_y$) (x>y), and the like. In addition, a stacked-layer structure in which the insulating films are appropriately combined may be employed. The mask may be formed by droplet discharging or by using a direct-write laser beam lithography system or the like.

Then, the insulating film is etched using the mask to form the second insulating film 926. The second insulating film 926 serves as a channel protective layer.

Then, a semiconductor film to serve as a second semiconductor region 925 is formed over the semiconductor film to serve as the first semiconductor region 924 and the second insulating film 926. The semiconductor film to serve as the second semiconductor region 925 is formed using a conductive amorphous semiconductor or a conductive microcrystalline semiconductor. When forming an n-channel TFT, an element belonging to Group 15, typically, phosphorus or arsenic is added. In addition, when forming a p-channel TFT, an element belonging to Group 13, typically, boron is added. The second semiconductor film is formed with a gas containing silicon added with an element belonging to Group 13 or Group 15 such as boron, phosphorus, or arsenic by plasma CVD.

Then, an oxide film formed over the semiconductor film to serve as the second semiconductor region 925 is removed and then, the semiconductor film to serve as the second semiconductor region 925 is partially irradiated with laser light. Here, laser light emitted from a direct-write laser beam lithography system is used. As a result, an insulating layer (not shown) is formed. Here, the semiconductor film is partially oxidized by energy of laser light and a silicon oxide film is formed as the insulating layer. In addition, the semiconductor film does not completely melt and remains as an amorphous semiconductor or a microcrystalline semiconductor.

Then, the semiconductor film to serve as the second semiconductor region 925 is etched using the insulating layer as a mask. In addition, the semiconductor film to serve as the first semiconductor region 924 is etched using the insulating layer to form the first semiconductor region 924. Then, the insulating layer is removed.

Then, a third conductive layer 927 (including the pixel electrode 909) to serve as a source electrode or a drain electrode is formed of a conductive material over the semiconductor film to serve as the second semiconductor region 925. The third conductive layer 927 may be formed appropriately of silver (Ag), aluminum (Al), gold (Au), or copper (Cu), or an alloy thereof or the like by a known method such as sputtering. Here, the conductive layer to serve as the third conductive layer 927 is formed by selectively ejecting a solution of Ag paste in which silver particles of several nm are dispersed, and then, baking the pasty solution.

Then, a photosensitive material (not shown) is ejected or applied over the conductive layer to serve as the third conductive layer 927, and then, dried. The photosensitive material is a material sensitive to ultraviolet light to infrared light, a negative photosensitive material, or a positive photosensitive material.

As the photosensitive material, a photosensitive resin material such as an epoxy resin, a phenol resin, a novolac resin, an acrylic resin, a melamine resin, or a urethane resin is used. In addition, an organic photosensitive material such as benzocyclobutene, parylene, polyimide, or the like can be used. As a typical positive photosensitive material, a photosensitive material containing a novolac resin and a naphthoquinonediazide compound which is a photosensitive agent can be given. As a typical negative photosensitive material, a base resin, a photosensitive material containing diphenylsilanediol, acid generator, and the like can be given. In this embodiment mode, a negative photosensitive material is used.

Then, a mask (not shown) is formed by emitting laser light to the photosensitive material using a direct-write laser beam lithography system, exposing the photosensitive material to the light, and developing the photosensitive material.

Then, the conductive layer to serve as the third conductive layer is etched to form the third conductive layer 927 to serve as a source electrode and a drain electrode, and the pixel electrode 909. The mask is also used for etching the semiconductor film to serve as the second semiconductor region 925, so that the second semiconductor region 925 to serve as a source region and a drain region is formed. By the step, the second insulating film 926 is exposed.

Although a channel protective TFT is formed in this embodiment mode, a channel etched TFT may be formed. In the latter case, an exposed portion of the semiconductor film to serve as the second semiconductor region 925 is etched and the semiconductor film is separated to form the second semiconductor region 925 to serve as a source region and the drain region. In the step, the first semiconductor region 924 is partially etched.

A passivation film 928 is preferably formed over the third conductive layer 927 and the second semiconductor region 925. The passivation film 928 can be formed of an insulating material such as silicon nitride, silicon oxide, silicon nitride oxide, silicon oxynitride, aluminum oxynitride, aluminum oxide, diamond-like carbon (DLC), or a carbon nitride (CN) by a thin film forming method such as plasma CVD or sputtering.

By the foregoing steps, a channel protective TFT can be formed. In addition, according to the present invention, a highly-integrated semiconductor device with high reliability can be formed.

This embodiment mode can be freely combined with Embodiment Modes 1 to 4.

Embodiment Mode 7

In this embodiment mode, a display panel used for the liquid crystal display device of Embodiment Mode 5 or the light emitting device of Embodiment Mode 6 is described with reference to FIG. 8.

Figure 8:
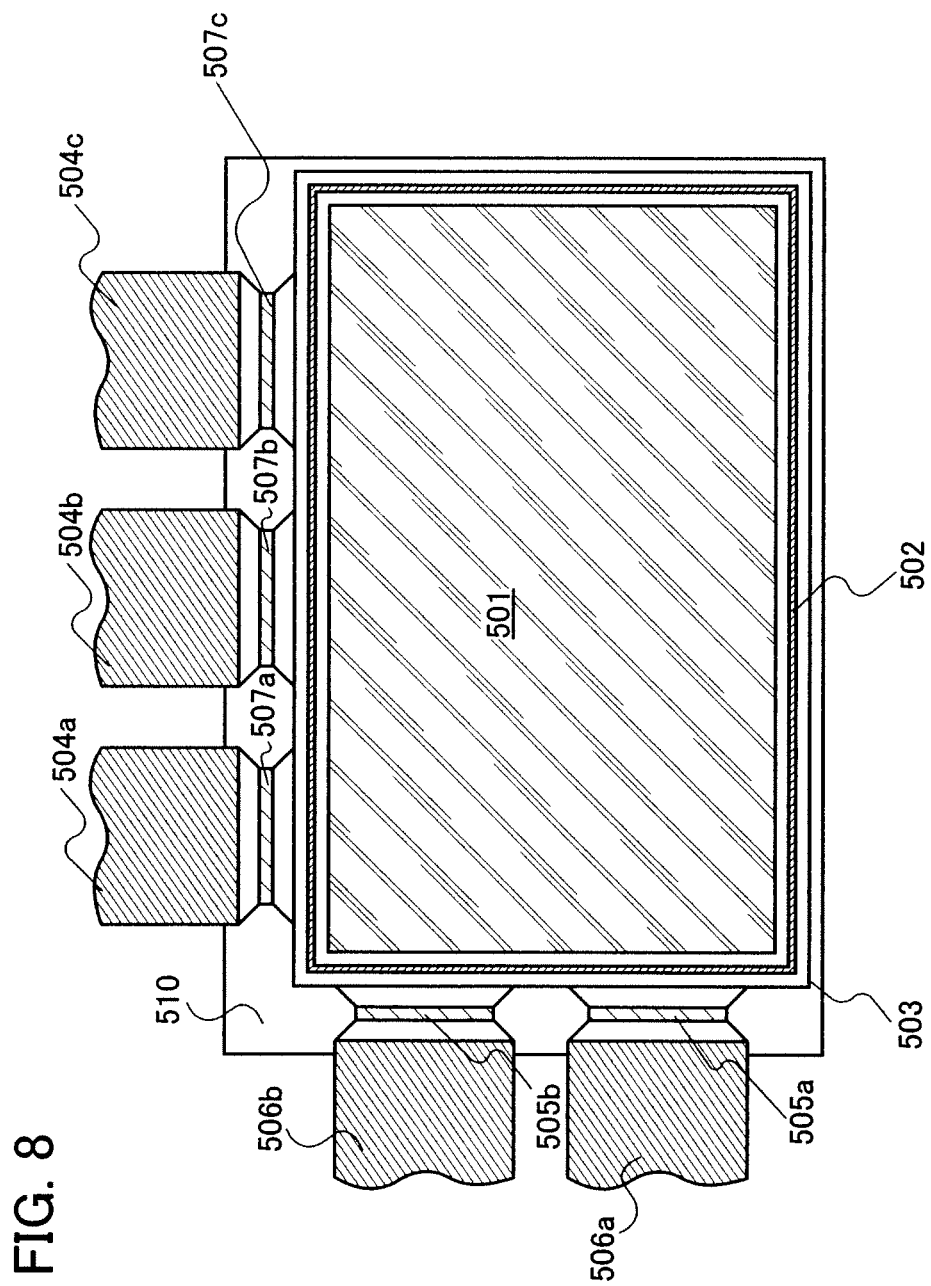
FIG. 8 shows an example of a module.

As to a module shown in FIG. 8, driver ICs including driver circuits are provided around a pixel portion 501 by COG (Chip On Glass). Needless to say, the driver ICs may be mounted by TAB (Tape Automated Bonding).

A substrate 510 is fixed with a counter substrate 503 and a sealant 502. The pixel portion 501 may have a liquid crystal as a display medium as shown in Embodiment Mode 5, or may have an EL element as a display medium as shown in Embodiment Mode 6. Driver ICs 505a and 505b and driver ICs 507a, 507b, and 507c can each have an integrated circuit which is formed of a single crystalline semiconductor or a polycrystalline semiconductor. The driver ICs 505a and 505b and driver ICs 507a, 507b, and 507c are supplied with signals or power through FPCs 506a and 506b, or FPCs 504a, 504b, and 504c.

As described above, this embodiment mode for carrying out the present invention can employ a manufacturing method or a structure of any one of Embodiment Modes 1 to 6.

Embodiment Mode 8

Figure 9A:
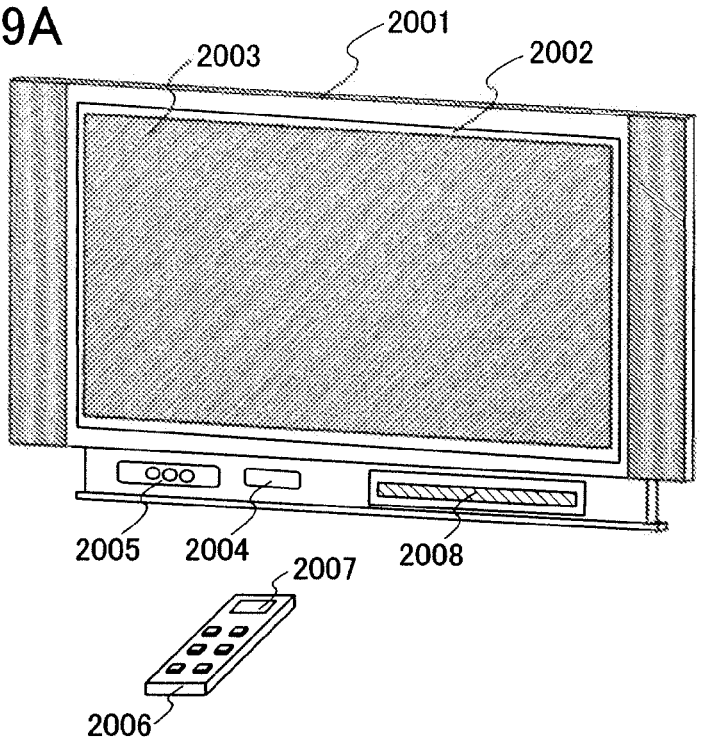
FIGS. 9A to 9C show examples of electronic appliances.
Figure 9B:
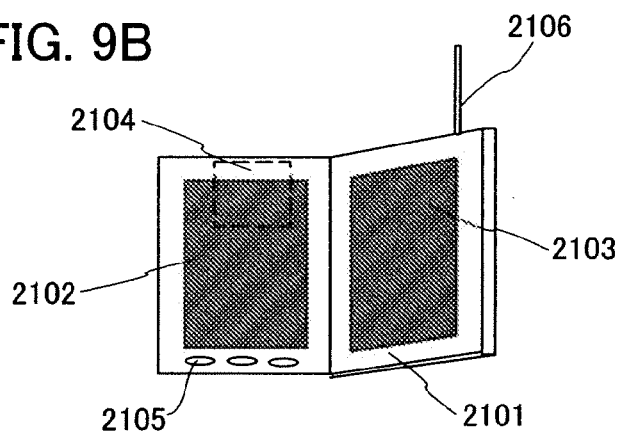
Figure 9C:
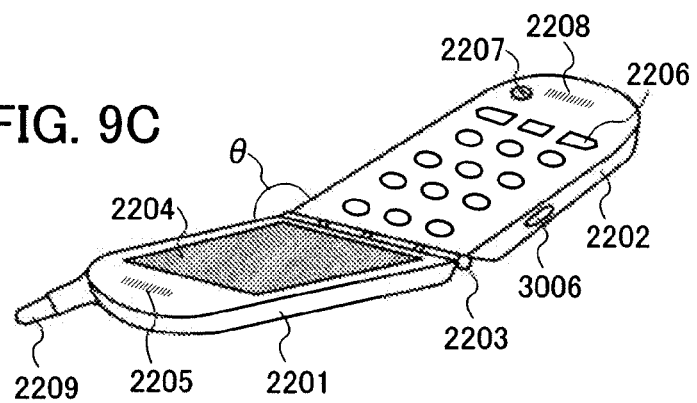

As examples of electronic appliances using the module of Embodiment Mode 7, a television receiver, a portable book (an electronic book), a cellular phone shown in FIGS. 9A to 9C can be manufactured.

As to a television receiver shown in FIG. 9A, a display module 2002 having liquid crystal or an EL element is incorporated in a chassis 2001. One-way (a sender to a receiver) or two way (a sender to/from a receiver, or a receiver to/from a receiver) information communication including reception of general television broadcast via a modem 2004 can be performed with the use of a receiver 2005 by connection to communication network with or without a wire. The television receiver can be operated by using a switch incorporated in the chassis or a remote controller 2006 which is separated from the chassis. The remote controller 2006 may also be provided with a display portion 2007 on which information to be outputted is displayed.

In the television receiver, a sub screen 2008 including a second display module may be provided in addition to a main screen 2003 in order to display the channel or the volume. In such a structure, the main screen 2003 may be formed of an EL display module having wide viewing angle and the sub screen may be formed of a liquid crystal display module which can display an image with low power consumption. Alternatively, in the case of prioritizing low power consumption, the main screen 2003 may be formed of a liquid crystal display module and the sub screen may be formed of an EL display module, and the sub screen may have a blinking function.

FIG. 9B shows a portable book (electronic book) including a main body 2101, display portions 2102 and 2013, a record medium 2104, an operation switch 2105, an antenna 2106, and the like.

FIG. 9C shows a cellular phone including a display panel 2201 and an operation panel 2202. The display panel 2201 and the operation panel 2202 are connected to each other in a joint 2203. As to the joint 2203, the angle θ between a face of the display portion 2204 in the display panel 2201 and a face of operation keys 2206 in the operation panel 2202 can be changed arbitrary. Further, a voice output portion 2205, the operation keys 2206, a power switch 2207, a sound input section 2208, and an antenna 2209 are also included.

In any example, a highly reliable television receiver, portable book, and cellular phone can be manufactured with high yield without increasing the number of steps by the present invention.

In the foregoing embodiment mode, the application of the present invention to a display has been mainly described; however, the present invention can be applied to other devices in other fields. For example, when the present invention is applied for forming a wires-overlapping portion or forming a contact wire in a process of an LSI, a highly reliable LSI can be manufactured without increasing the number of steps.

As described above, by carrying out the present invention, that is, by using any one of manufacturing methods or structures in Embodiment Modes 1 to 7, various electronic devices can be completed.

A structure of the present invention, that is, the present invention has a portion in which wires are intersected (an overlapping portion), in which a lower wire has a two-layer structure and a first layer thereof is wider than that of a second layer formed thereover. Therefore, a steep step is relieved and step coverage of an interlayer insulator deposited thereover can be improved.

As described in embodiment modes, the present invention with which a breaking of wire or poor connection of contact wire can be prevented can be applied to a manufacturing method for various types of semiconductor elements such as a top gate TFT or an inverted staggered TFT. In addition, the present invention can be applied for manufacturing an active matrix substrate using the semiconductor element, a liquid crystal display device using the substrate, a display of an EL display device, and the like, and further, can be applied for a field of an LSI and the application range is wide.

This application is based on Japanese Patent Application serial no. 2005-303674 filed in Japan Patent Office on Oct. 18, 2005, the entire contents of which are hereby incorporated by reference.

What is claimed is:

1. A method for manufacturing a semiconductor device, comprising:

forming a first conductive film on an insulating surface;

forming a second conductive film on and in contact with the first conductive film;

forming a first mask and a second mask over the second conductive film using a photo mask or a reticle each of which is provided with a pattern having a light intensity reducing function, the pattern comprising a diffraction grating pattern or a semi-translucent film wherein the first mask is partially thin;

forming a first wire and a second wire by etching the first conductive film and the second conductive film using the first mask and the second mask, wherein the second wire corresponding to the second conductive film has a part narrower than the first wire corresponding to the first conductive film;

forming an insulating film covering the first wire and the second wire;

forming an opening portion in the insulating film, to expose at least a top surface of the first wire and a top surface of the second wire through the opening portion; and forming a third wire over the insulating film to electrically connect the first wire and the second wire therewith through the opening portion.

2. The method for manufacturing the semiconductor device according to claim 1, wherein the opening portion is overlapped with an edge of the second wire.

3. The method for manufacturing the semiconductor device according to claim 1, wherein an edge of the first wire is projected from the edge of the second wire, and the first wire is longer than the second wire.

4. The method for manufacturing the semiconductor device according to claim 1,
wherein the first wire, the second wire, and a semiconductor element are formed over one substrate,
wherein the semiconductor element has a semiconductor layer, a gate insulating film, and a gate electrode,
wherein the gate electrode is formed by a first gate electrode and a second gate electrode formed on and in contact with the first gate electrode,
wherein the first gate electrode is formed of same material and by a same step as the first wire, and
wherein the second gate electrode is formed of same material and by a same step as the second wire.

5. The method for manufacturing the semiconductor device, according to claim 1, wherein side surfaces of the first wire and the second wire form tapered shapes using the photo mask or the reticle each of which is provided with the pattern having the light intensity reducing function.

6. The method for manufacturing the semiconductor device, according to claim 1, wherein the first mask is formed using the photo mask to have at least one interior angle of 180° or more in a cross-section in a direction perpendicular to the insulating surface.

7. A method for manufacturing a semiconductor device, comprising:
forming a first conductive film on an insulating surface;
forming a second conductive film over the first conductive film to be in contact with each other;
forming a first mask and a second mask over the second conductive film using a photo mask or a reticle each of which is provided with a pattern having a light intensity reducing function, the pattern comprising a diffraction grating pattern or a semi-translucent film wherein the first mask has at least two different thicknesses;
forming a first wire and a second wire by etching the first conductive film and the second conductive film using the first mask and the second mask wherein the second wire corresponding to the second conductive film has a part narrower than the first wire corresponding to the first conductive film;
forming an insulating film covering the first wire and the second wire; and
forming an opening portion in the insulating film to expose at least a top surface of the first wire and a top surface of the second wire through the opening portion; and
forming a third wire over the insulating film to electrically connect the first wire and the second wire therewith through the opening portion.

8. The method for manufacturing the semiconductor device according to claim 7, wherein the opening portion is overlapped with an edge of the second wire.

9. The method for manufacturing the semiconductor device according to claim 7, wherein an edge of the first wire is projected from the edge of the second wire, and the first wire is longer than the second wire.

10. The method for manufacturing the semiconductor device according to claim 7,
wherein the first wire, the second wire, and a semiconductor element are formed over one substrate,
wherein the semiconductor element has a semiconductor layer, a gate insulating film, and a gate electrode,
wherein the gate electrode is formed by a first gate electrode and a second gate electrode formed on and in contact with the first gate electrode,
wherein the first gate electrode is formed of same material and by a same step as the first wire, and
wherein the second gate electrode is formed of same material and by a same step as the second wire.

11. The method for manufacturing the semiconductor device, according to claim 7, wherein side surfaces of the first wire and the second wire form tapered shapes using the photo mask or the reticle each of which is provided with the pattern having the light intensity reducing function.

12. The method for manufacturing the semiconductor device, according to claim 7, wherein the first mask is formed using the photo mask to have at least one interior angle of 180° or more in a cross-section in a direction perpendicular to the insulating surface.

* * * * *